US011923427B2

(12) United States Patent
Lin et al.

(10) Patent No.: US 11,923,427 B2
(45) Date of Patent: Mar. 5, 2024

(54) SEMICONDUCTOR DEVICE

(71) Applicant: TAIWAN SEMICONDUCTOR MANUFACTURING CO., LTD., Hsinchu (TW)

(72) Inventors: Meng-Han Lin, Hsinchu (TW); Wei-Cheng Wu, Hsinchu County (TW); Te-Hsin Chiu, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 199 days.

(21) Appl. No.: 17/185,915

(22) Filed: Feb. 25, 2021

(65) Prior Publication Data

US 2021/0184012 A1    Jun. 17, 2021

Related U.S. Application Data

(62) Division of application No. 16/195,680, filed on Nov. 19, 2018, now Pat. No. 10,937,879.

(Continued)

(51) Int. Cl.
*H01L 29/66* (2006.01)
*H01L 21/02* (2006.01)
(Continued)

(52) U.S. Cl.
CPC .. *H01L 29/42368* (2013.01); *H01L 21/02244* (2013.01); *H01L 29/40117* (2019.08);
(Continued)

(58) Field of Classification Search
CPC ......... H01L 29/42368; H01L 21/02244; H01L 29/40117; H01L 29/42344;
(Continued)

(56) References Cited

U.S. PATENT DOCUMENTS 6,548,363 B1    4/2003 Wu et al.
2002/0005545 A1    1/2002 Widdershoven et al.
(Continued)

FOREIGN PATENT DOCUMENTS

CN    1855511 A    11/2006
CN    101055877 A    10/2007
(Continued)

OTHER PUBLICATIONS

Zhanbin Li, "Study on Reliability Improvement of 0.35 Micron Sonos Nonvolatile Memories Device" a Dissertation submitted to Shanghai Jiao Tong University for Master Degree of Engineering, Dec. 31, 2008.

(Continued)

*Primary Examiner* — Moin M Rahman
(74) *Attorney, Agent, or Firm* — Maschoff Brennan

(57) ABSTRACT

A semiconductor device includes a semiconductor substrate, a control gate, a select gate, a charge trapping structure, and a dielectric structure. The semiconductor substrate has a drain region, a source region, and a channel region between the drain region and the source region. The control gate is over the channel region of the semiconductor substrate. The select gate is over the channel region of the semiconductor substrate and separated from the control gate. The charge trapping structure is between the control gate and the semiconductor substrate. The dielectric structure is between the select gate and the semiconductor substrate. The dielectric structure has a first part and a second part, the first part is between the charge trapping structure and the second part, and the second part is thicker than the first part.

20 Claims, 43 Drawing Sheets

Related U.S. Application Data

(60) Provisional application No. 62/592,849, filed on Nov. 30, 2017.

(51) Int. Cl.
  *H01L 21/28* (2006.01)
  *H01L 29/423* (2006.01)
  *H01L 29/792* (2006.01)
  *H10B 43/35* (2023.01)
  *H10B 43/40* (2023.01)

(52) U.S. Cl.
  CPC .. *H01L 29/42344* (2013.01); *H01L 29/66833* (2013.01); *H01L 29/792* (2013.01); *H10B 43/35* (2023.02); *H10B 43/40* (2023.02)

(58) Field of Classification Search
  CPC ............. H01L 29/66833; H01L 29/792; H01L 29/40114; H01L 27/11568; H01L 27/11573; H01L 28/00; H01L 29/518; H01L 29/513; H01L 29/4933; H01L 29/42328; H01L 29/788; H01L 29/66825; H01L 21/0217; H01L 21/0214; H01L 29/665; H01L 29/6656; H01L 27/1157; H01L 27/11529; H01L 23/5226; H01L 23/528; H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/66545; H01L 29/7883; H01L 21/76831; H01L 21/76805; H01L 29/78; H10B 43/35; H10B 43/40; H10B 61/00–22; H10B 12/0383; H10B 12/395; H10B 20/30; H10B 41/41; H10B 41/43; H10B 41/49; H10B 63/34; H10B 12/053; H10B 12/056; H10B 12/05; H10B 12/36; H10B 10/12; H10B 43/27; H10B 41/27; H10B 41/30; H10B 43/30; H10B 43/10; H10B 43/50; H10B 41/35; H10B 41/50; H10N 12/00–50; H10N 50/80; H10N 50/85; H10N 50/01

See application file for complete search history.

(56) References Cited

U.S. PATENT DOCUMENTS

| | | | |
|---|---|---|---|
| 2005/0085039 A1* | 4/2005 | Yasui | H10B 69/00 438/257 |
| 2005/0253184 A1 | 11/2005 | Hung et al. | |
| 2006/0192266 A1 | 8/2006 | Willer et al. | |
| 2007/0241386 A1 | 10/2007 | Wang et al. | |
| 2008/0188052 A1* | 8/2008 | Winstead | H01L 29/40114 257/E21.422 |
| 2008/0266960 A1 | 10/2008 | Kuo | |
| 2008/0290380 A1 | 11/2008 | Sheu et al. | |
| 2009/0014722 A1 | 1/2009 | Doi | |
| 2009/0057744 A1 | 3/2009 | Weimer et al. | |
| 2010/0084718 A1 | 4/2010 | Liu et al. | |
| 2014/0091380 A1 | 4/2014 | Hang | |
| 2015/0145022 A1 | 5/2015 | Chuang | |
| 2015/0249145 A1 | 9/2015 | Yoshimori et al. | |
| 2015/0279849 A1 | 10/2015 | Chang et al. | |
| 2015/0280004 A1 | 10/2015 | Wu et al. | |
| 2016/0049420 A1 | 2/2016 | Chang | |
| 2016/0190269 A1 | 6/2016 | Brown et al. | |
| 2017/0077110 A1 | 3/2017 | Liu | |
| 2017/0141201 A1 | 5/2017 | Fang | |
| 2017/0186762 A1 | 6/2017 | Pan et al. | |
| 2018/0166458 A1* | 6/2018 | Kang | H10B 43/40 |

FOREIGN PATENT DOCUMENTS

| | | |
|---|---|---|
| CN | 101299430 A | 11/2008 |
| CN | 101312210 A | 11/2008 |
| CN | 101345246 A | 1/2009 |
| CN | 101673765 A | 3/2010 |
| CN | 101714522 A | 5/2010 |
| CN | 104882413 A | 9/2015 |
| CN | 104952479 A | 9/2015 |
| CN | 105742169 A | 7/2016 |
| CN | 107039452 A | 8/2017 |
| TW | 201631634 A | 9/2016 |
| TW | 201735328 A | 10/2017 |

OTHER PUBLICATIONS

C. Charpin-Nicolle et al., "A technological and electrical study of self-aligned charge-trap split-gate memory devices", Microelectronic Engineering 118 (2014), 15-19.

* cited by examiner

SEMICONDUCTOR DEVICE

PRIORITY CLAIM AND CROSS-REFERENCE

This application is a divisional application of U.S. patent application Ser. No. 16/195,680, filed Nov. 19, 2018, now U.S. Pat. No. 10,937,879, issued Mar. 2, 2021, which claims priority of U.S. Provisional Application Ser. No. 62/592,849, filed Nov. 30, 2017, the entirety of which is incorporated by reference herein in their entireties.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
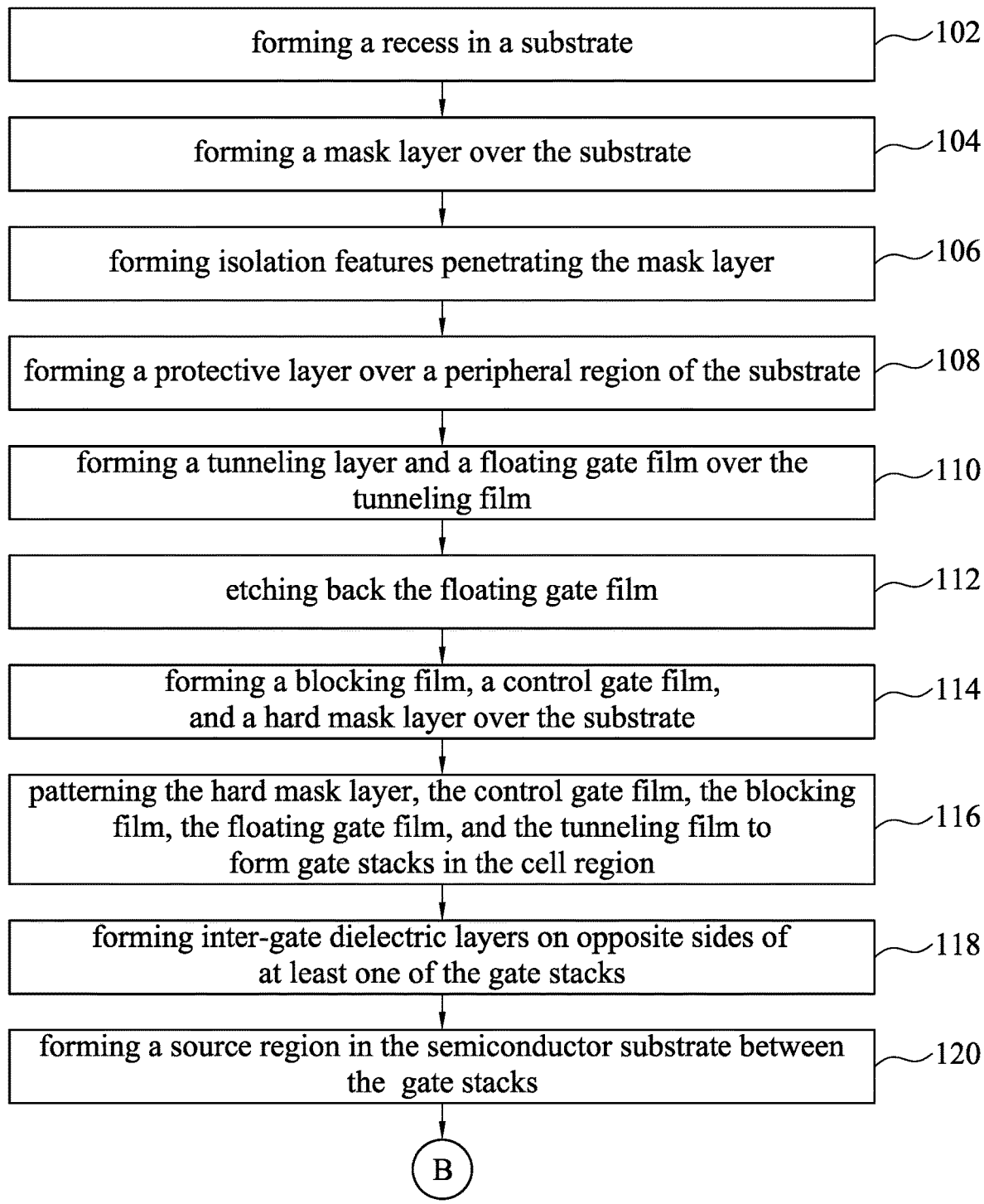
FIGS. 1A-1C are a flow chart of a method for fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flash memory can be formed on a bulk silicon substrate and uses various bias conditions to read and write data values. For example, an ESF3 cell—or so-called "third generation SUPERFLASH" cell—includes a pair of symmetric split gate memory cells, each of which includes a pair of source/drain regions with a channel region arranged there between. In the ESF3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the ESF3 cell and a sidewall of the floating and/or control gate). At least one cell is configured to store a variable charge level on its floating gate, wherein the level of this charge corresponds to a data state stored in the cell and is stored in a non-volatile manner so that the stored charge/data persists in the absence of power.

By changing the amount of charge stored on the floating gate, the threshold voltage $V_{th}$ of the memory cell device can be correspondingly changed. For example, to perform a program operation (e.g., write a logical "0", program is 0, Vt high) for a cell, the control gate is biased with a high (e.g., at least an order of magnitude higher) voltage relative a voltage applied across the channel region and/or relative to a voltage applied to the select gate. The high bias voltage promotes Fowler-Nordheim tunneling of carriers from the channel region towards the control gate. As the carriers tunnel towards the control gate, the carriers become trapped in the floating gate and alter the $V_{th}$ of the cell. Conversely, to perform an erase operation (e.g., write a logical "1", erase is 1, Vt low) for the cell, the erase gate is biased with a high (e.g., at least an order of magnitude higher) voltage relative a voltage applied across the channel region and/or relative to a voltage applied to the control gate. The high bias voltage promotes Fowler-Nordheim tunneling of carriers from the floating gate towards the erase gate, thereby removing carriers from the floating gate and again changing the $V_{th}$ of the cell in a predictable manner. Subsequently, during a read operation, a voltage is applied to the select gate to induce part of the channel region to conduct. Application of a voltage to the select gate attracts carriers to part of the channel region adjacent to the select gate. While the select gate voltage is applied, a voltage greater than $V_{th}$, but less than $V_{th}+\Delta V_{th}$, is applied to the control gate (where $\Delta V_{th}$ is a change in $V_{th}$ due to charge trapped on the floating gate). If the memory cell device turns on (i.e., allows charge to flow), then it is deemed to contain a first data state (e.g., a logical "1" is read). If the memory cell device does not turn on, then it is deemed to contain a second data state (e.g., a logical "0" is read).

Some embodiments of the present disclosure relate to flash memory devices that are formed on a recessed region of a substrate. Although some implementations are illustrated below with regards to split gate flash memory, it will be appreciated that this concept is not limited to split gate flash memory cells, but is also applicable to other types of flash memory cells as well as to other types of semiconductor devices, such as MOSFETs, FinFETs, and the like.

Figure 1B:
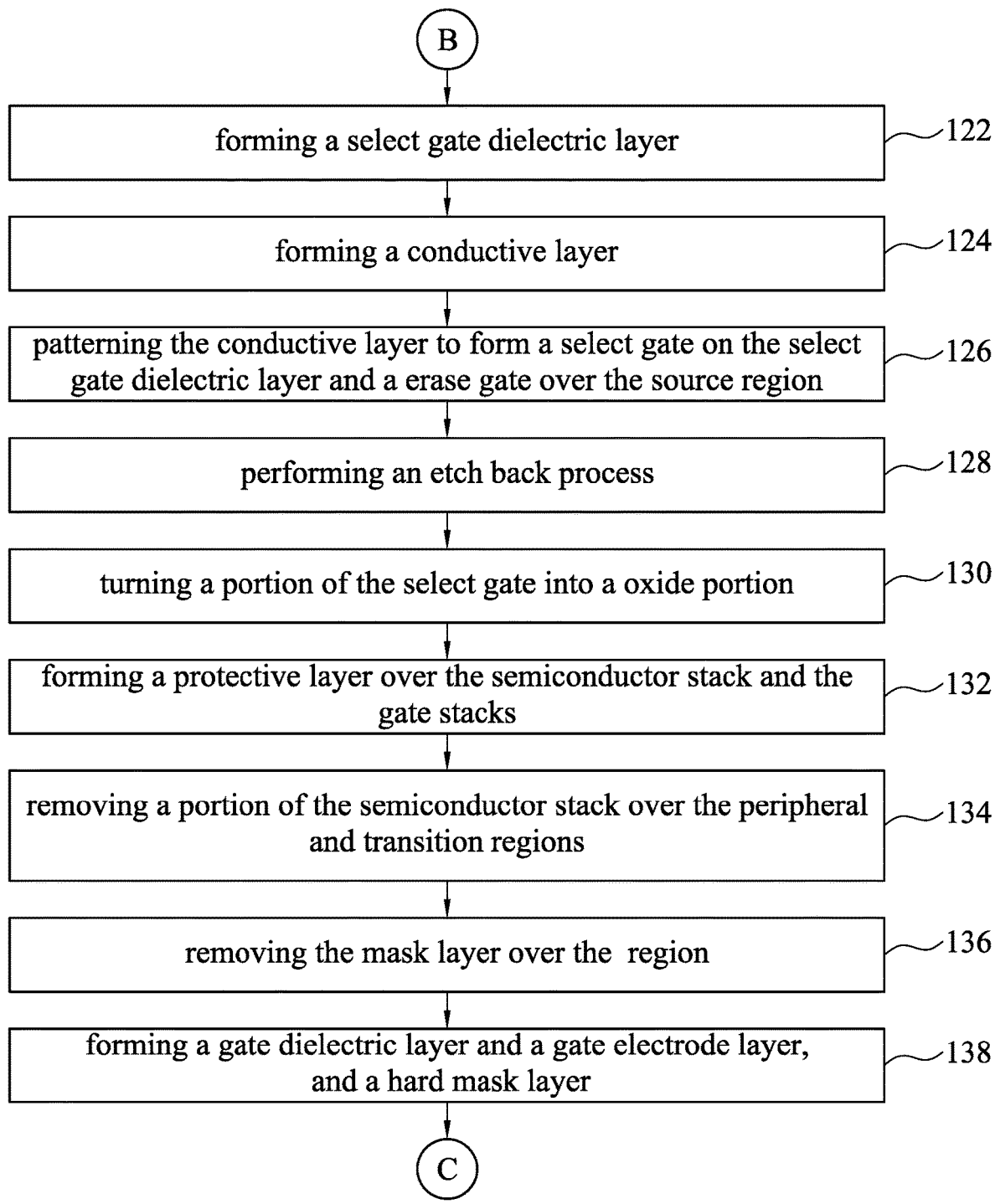
Figure 1C:
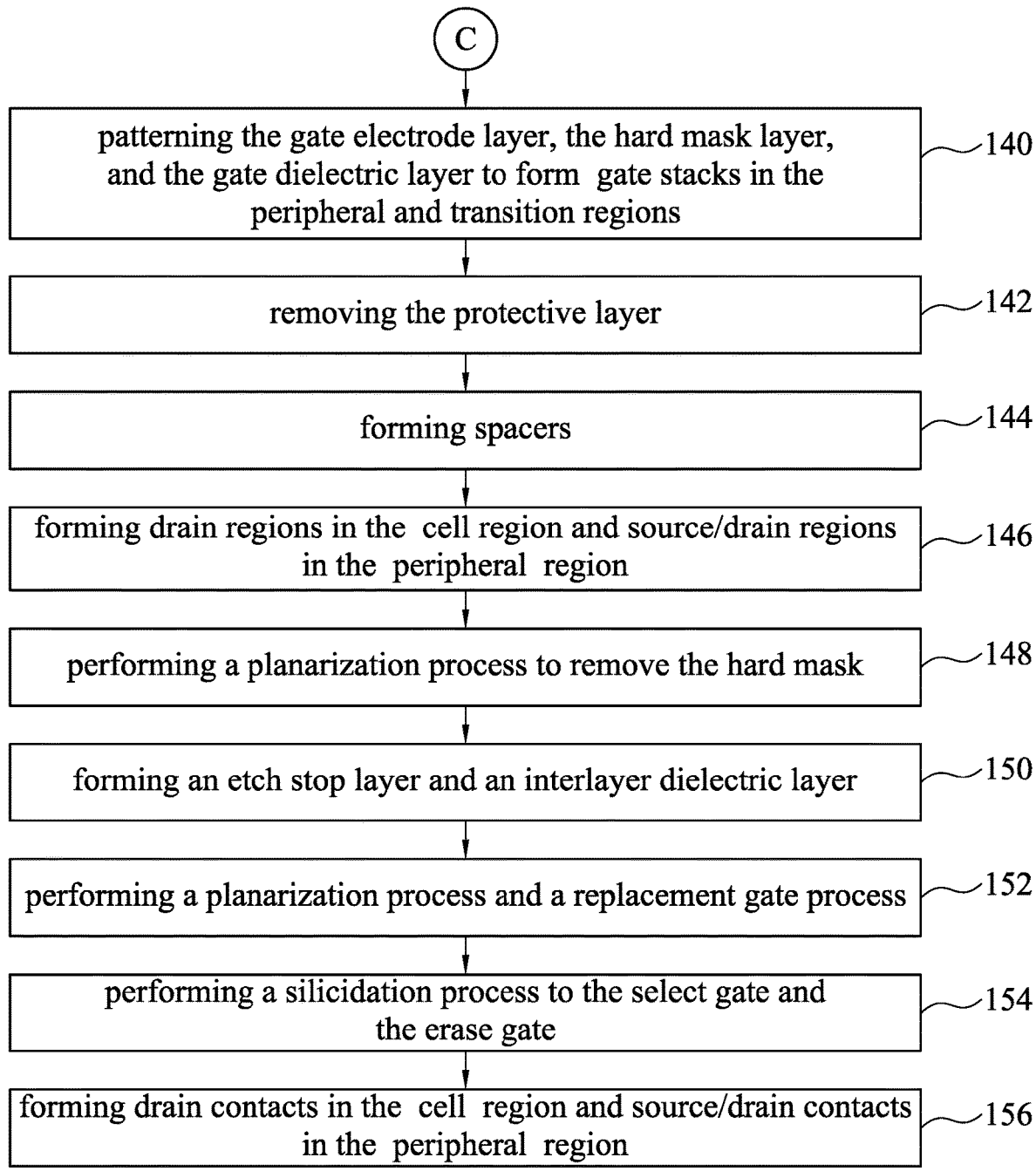

FIGS. 1A-1C is a flow chart of a method 100 for manufacturing a semiconductor device at different stages in accordance with some embodiments. FIGS. 2 to 30B are cross-sectional views at different stages of the method 100 for manufacturing the semiconductor device in accordance with some embodiments. It is understood that additional steps may be implemented before, during, or after the method 100, and some of the steps described may be replaced or eliminated for other embodiments of the method 100.

Figure 2:
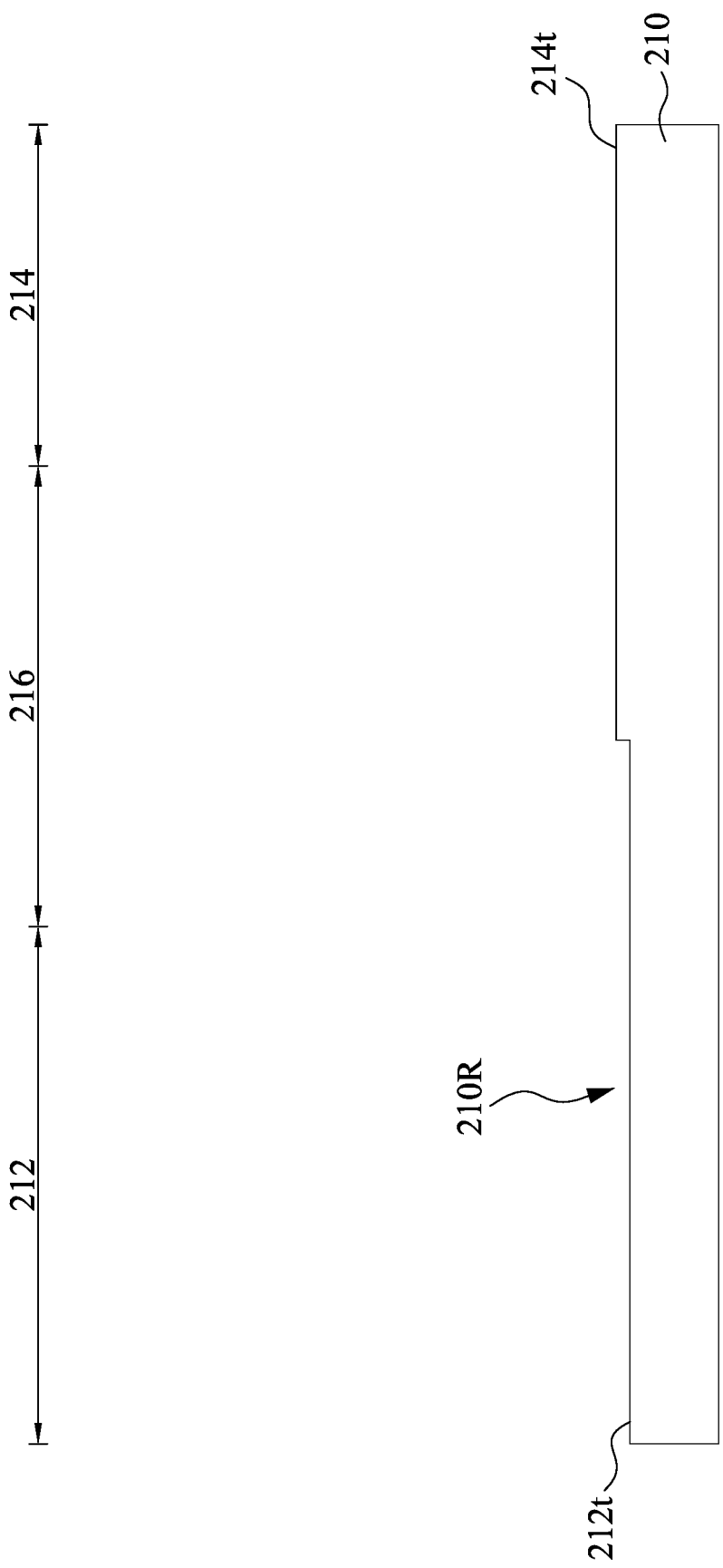
FIGS. 2 to 30B are cross-sectional views at different stages of the method for manufacturing a semiconductor device in accordance with some embodiments.

Referring to FIG. 1A and FIG. 2, the method 100 begins at step 102 where a recess 210R is formed over a substrate 210. In some embodiments, the substrate 210 can be a semiconductor substrate, such as a bulk silicon substrate, a germanium substrate, a compound semiconductor substrate, or other suitable substrate. The substrate 210 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 210 includes a cell region 212, a peripheral region 214, and a transition region 216. The peripheral region 214 is located at an edge of the cell region 212. For example, the peripheral region 214 surrounds the cell region 212. The transition region 216 is disposed between the cell region 212 and the peripheral region 214.

The formation of the recess 210R may include forming a patterned pad layer and a patterned mask layer (not shown) over the peripheral region 214 and one portion of the transition region 216. In some embodiments, the pad layer may be formed of dielectric material, such as an oxide layer, and the mask layer may be formed of dielectric material, such as silicon nitride (SiN) or other suitable materials. Then, a surface layer of the exposed region of the substrate 210 not covered by the pad layer is oxidized using, for example, wet oxidation. Thereafter, the oxidized surface layer is removed from the substrate 210 using, for example, wet etching, dry etching, or a combination of wet etching and dry etching. The removal of oxidized surface layer results in the recess 210R in the cell region 212. For example, a top surface 212t of the cell region 212 is lower than a top surface 214t of the peripheral region 214. In some embodiments, the depth of the recess 210R is about 50 Angstroms to about 2000 Angstroms.

Figure 3:
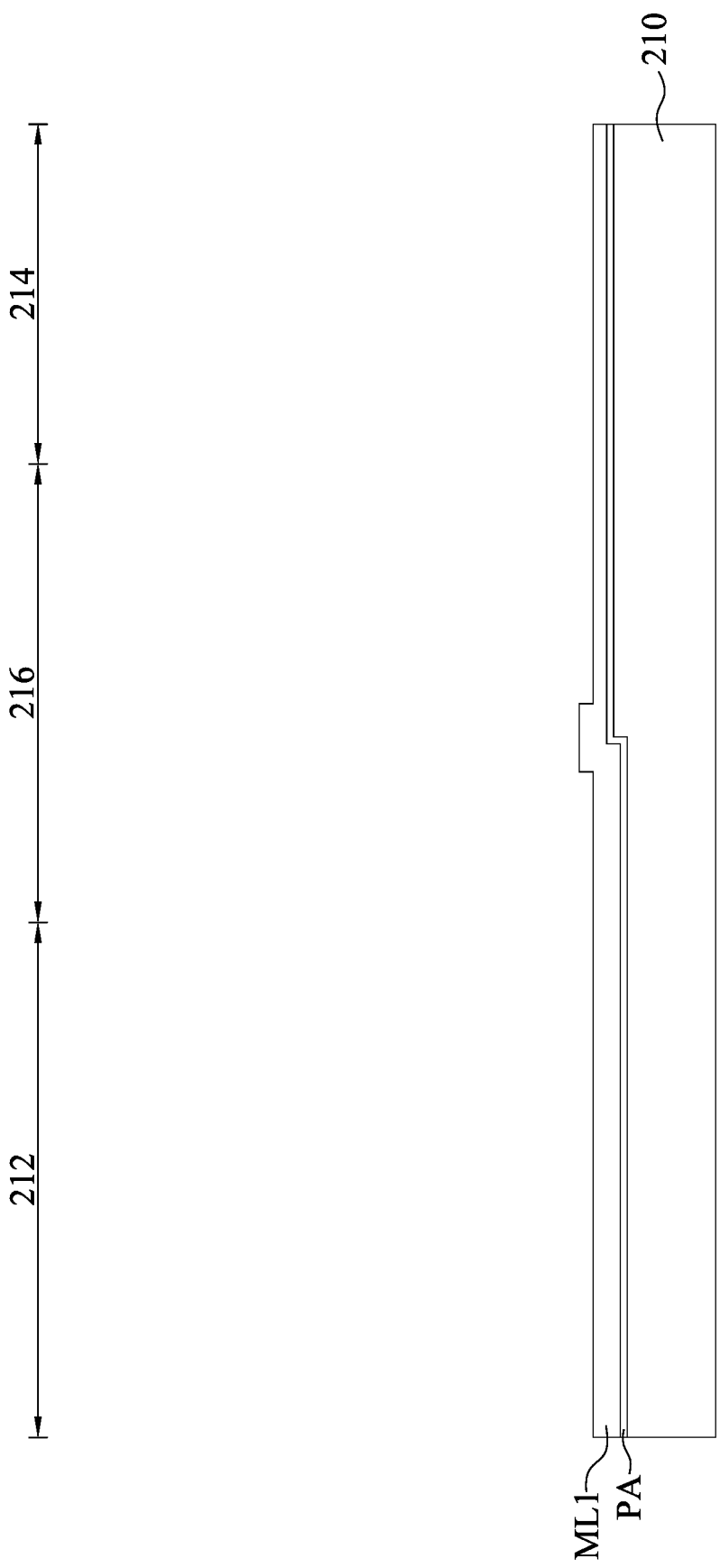

Referring to FIG. 1A and FIG. 3, the method 100 proceeds to step 104 where a pad layer PA and a mask layer ML1 are conformally formed over the substrate 210 in a sequence. In some embodiments, the pad layer PA may be formed of dielectric material, such as an oxide layer. The mask layer ML1 may be made of silicon nitride or other suitable materials. The mask layer ML1 may include a single layer or multiple layers. In some embodiments, the pad layer PA and the mask layer ML1 may be formed using chemical vapor deposition (CVD), physical vapor deposition (PVD), atomic layer deposition (ALD), ozone oxidation, other suitable processes, or combinations thereof. After depositing the mask layer ML1, an optional etching process can be performed to etch back a portion of the mask layer ML1 over the peripheral region 214. During the etching process, the cell region 212 can be protected by a patterned photoresist.

Figure 4:
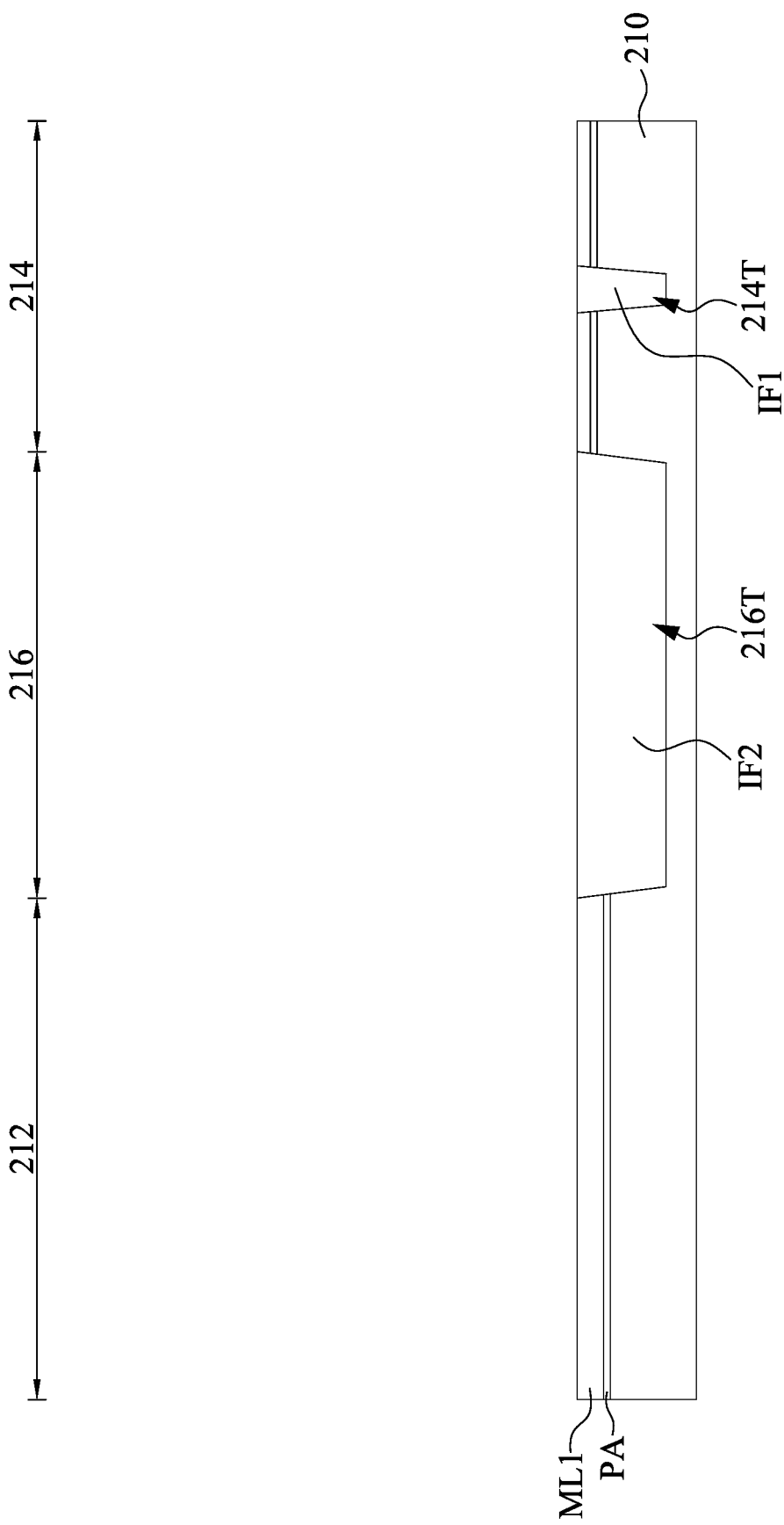

Referring to FIG. 1A and FIG. 4, the method 100 proceeds to step 106 where isolation features IF1 and IF2 are formed in the substrate 210 and through the pad layer PA and the mask layer ML1. Specifically, prior to the formation of the isolation features IF1 and IF2, trenches 214T and 216T are formed in the substrate 210. The trenches 214T and 216T are formed by forming a photoresist over the structure of FIG. 3, the photoresist covering some portions of the mask layer ML1 while leaving other regions of the mask layer ML1 exposed, performing an etch process to remove the exposed portions of the mask layer ML1 so as to pattern the mask layer ML1, and performing an etch process to remove portions of the pad layer PA exposed by the patterned mask ML1 and the corresponding portions of the substrate 210 underneath. As such, trenches 214T and 216T are formed. In some embodiments, the trench 214T is formed in the peripheral region 214, and the trench 216T is formed in the transition region 216.

Then, a dielectric material overfills the trenches 214T and 216T. In some embodiments, the dielectric material includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other CVD methods. The formation of the liner oxide reduces the electrical fields and hence improves the performance of the resulting semiconductor device. A chemical mechanical polish (CMP) is then performed to substantially level the top surface of the dielectric material with the top surfaces of the patterned mask ML1 to form a plurality of isolation features IF1 and IF2 in the trenches 214T and 216T. It is noted that the number of the isolation feature IF1 can be plural in some other embodiments. The isolation feature IF1 is disposed in the peripheral region 214 of the substrate 210, and the isolation feature IF2 is at least disposed in the transition region 216 of the substrate 210.

Figure 5:
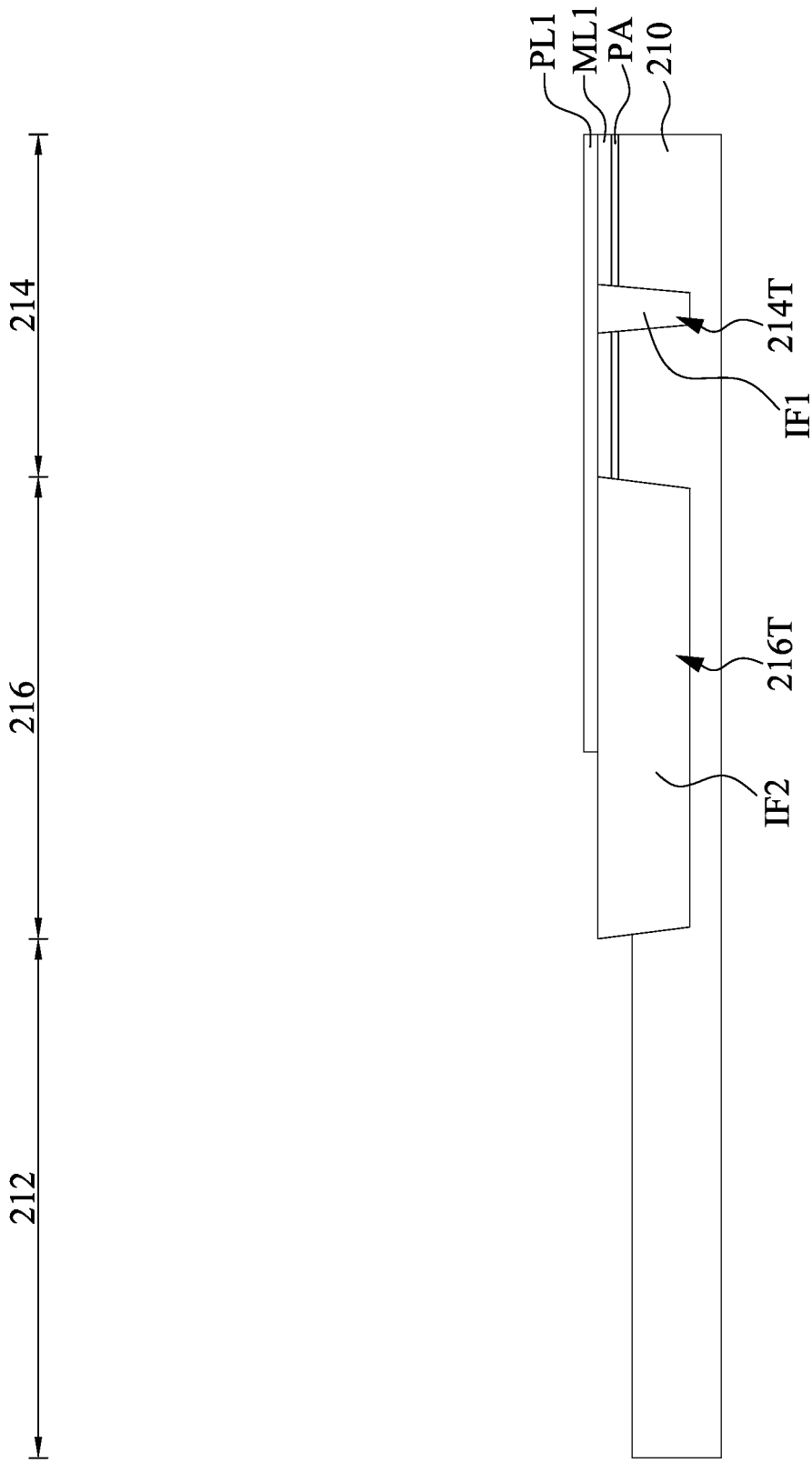

Referring to FIG. 1A and FIG. 5, the method 100 proceeds to step 108 where a protective layer PL1 is formed over the peripheral region 214 of the substrate 210. The protective layer PL1 is, for example, made of silicon oxide, silicon nitride, other suitable material, or the combination thereof. Formation of the protective layer PL1 includes, for example, depositing a blanket layer of protective material over the substrate 210, followed by patterning the blanket layer to form the protective layer PL1 over the peripheral region 214 and not over the cell region 212. The protective layer PL1 may cover a portion of a top surface of the isolation feature IF2. Afterwards, the pad layer PA and the mask layer ML1 in the cell region 212 exposed by the patterned protective layer PL1 are removed using a suitable etching process.

Figure 6:
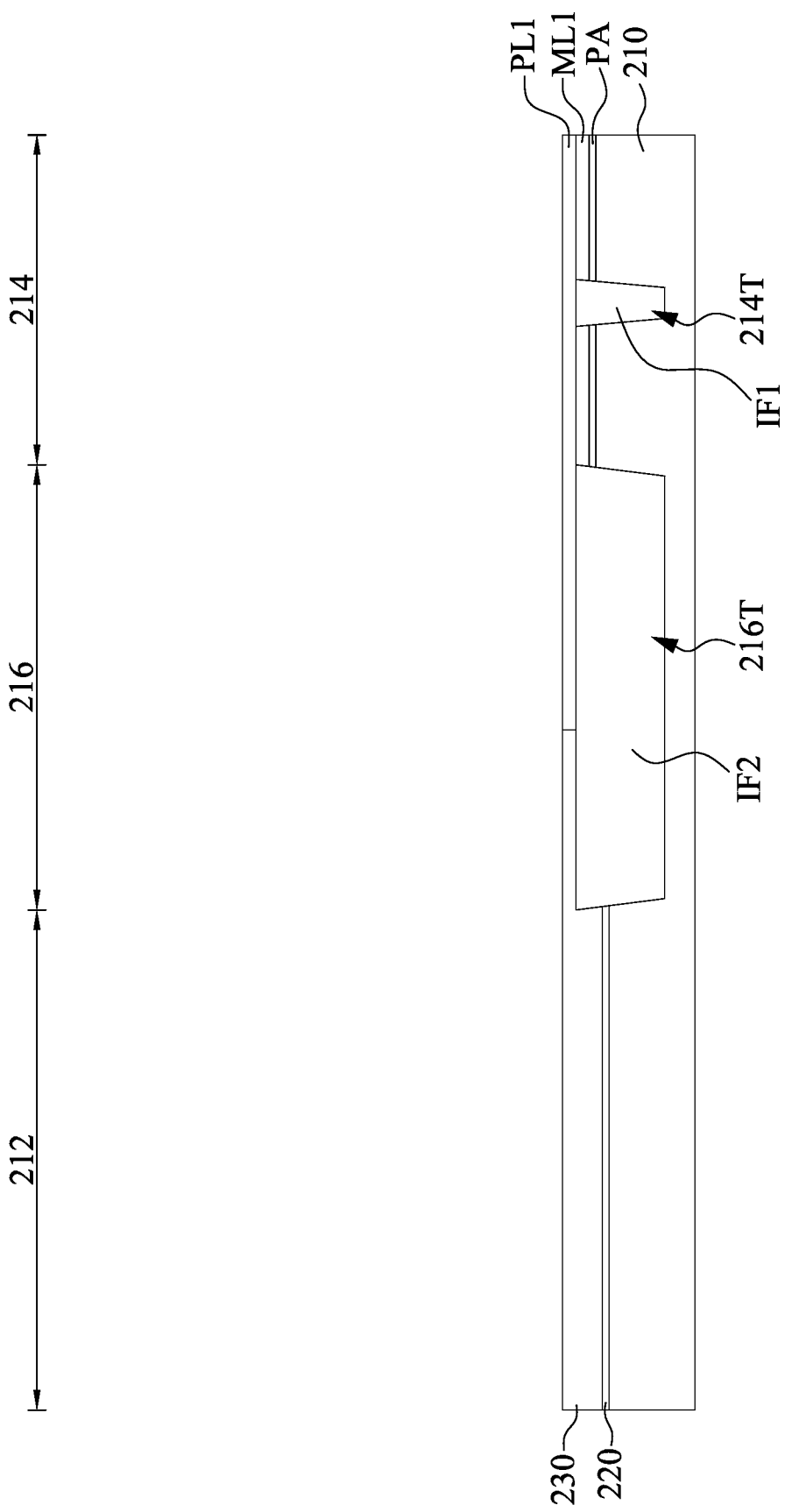

Referring to FIG. 1A and FIG. 6, the method 100 proceeds to step 110, a tunneling layer 220 is formed over the substrate 210 exposed by the patterned protective layer PL1, and a floating gate layer 230 is formed over the tunneling layer 220. The tunneling layer 220 may include, for example, a dielectric material such as silicon dioxide ($SiO_2$), silicon nitride ($Si_3N_4$), silicon oxynitride (SiON), high-k materials, other non-conductive materials, or combinations thereof. The tunneling layer 220 may be formed using thermal oxidation, ozone oxidation, other suitable processes, or combinations thereof. The floating gate layer 230 may include polysilicon formed through, for example low pressure CVD (LPCVD) methods, CVD methods and PVD sputtering methods employing suitable silicon source materials. In some embodiments, the floating gate layer 230 may be ion implanted. In some other embodiments, the floating gate layer 230 may be made of metal, metal alloys, single crystalline silicon, or combinations thereof. For example, a polysilicon layer is conformally formed over the tunneling layer 220, and then a CMP process is performed to remove a portion of the polysilicon layer, such that a remaining portion of the polysilicon layer (i.e. the floating gate layer 230) is planarized until the protective layer PL1 is exposed. The protective layer PL1 has a higher resistance to the planarization than that of the floating gate layer 230. For example, the protective layer PL1 may serve as a CMP stop layer.

Figure 7:
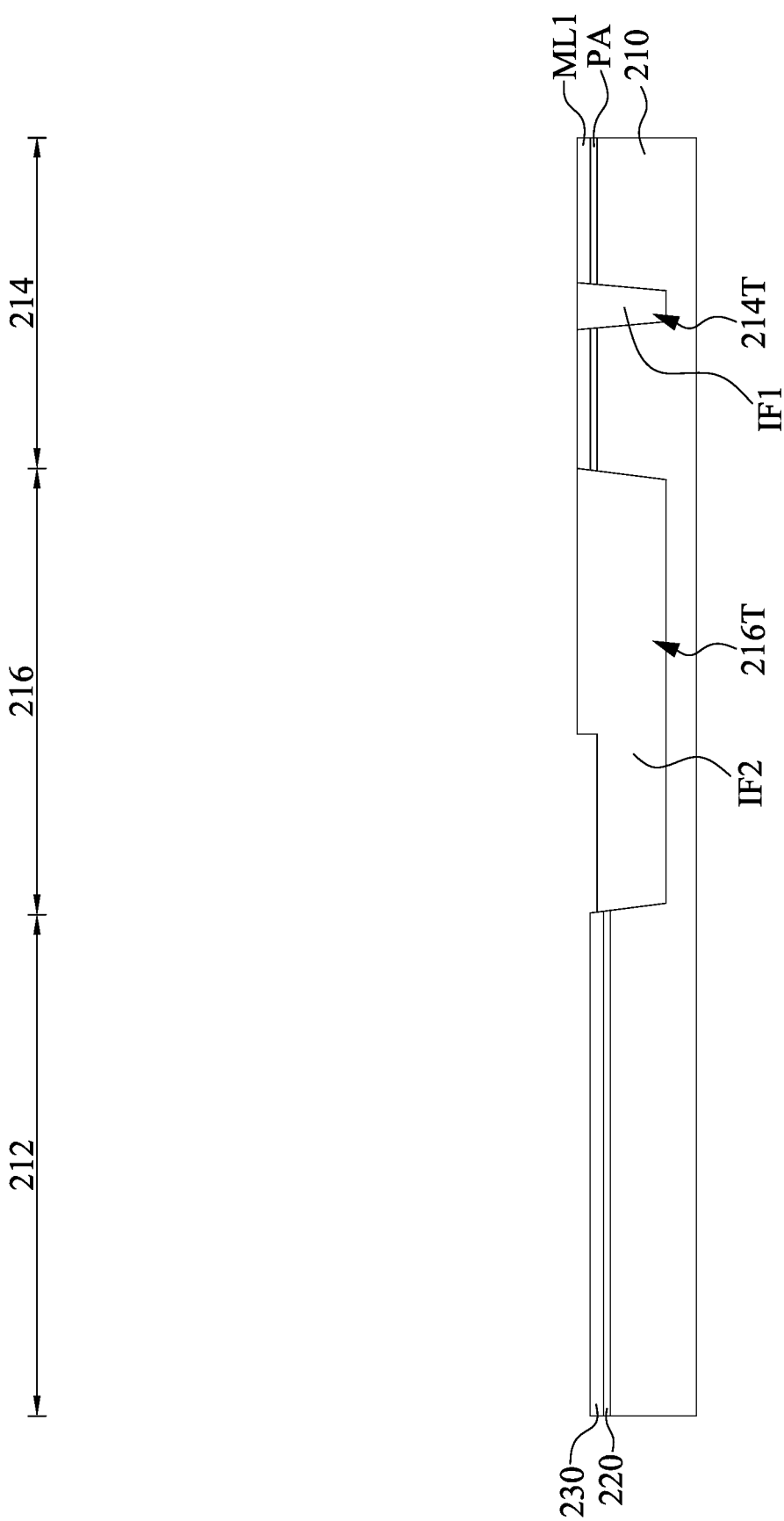

Referring to FIG. 1A and FIG. 7, the method 100 proceeds to step 112 where an etch back process is performed. Herein, the protective layer PL1 (referring to FIG. 6) may have a higher etch resistance to the etch back process than that of the floating gate layer 230 and isolation features IF1 and IF2. The floating gate layer 230 and the isolation feature IF2 in the cell region 212 are etched, while the protective layer PL1 (referring to FIG. 6) remains substantially intact. The etching back may recess a portion of the isolation feature IF2 free from coverage by the protective layer PL1, thus resulting in a notched corner on the isolation feature IF2. Herein, the floating gate layer 230 may have an etch resistance to the etch back process higher than that of the isolation feature IF2, such that after the etching back, the floating gate layer 230 has a top surface higher than that of the recessed portion of the isolation feature IF2. After the etching back, the protective layer PL1 (referring to FIG. 6) is removed by a suitable etching process.

Figure 8:
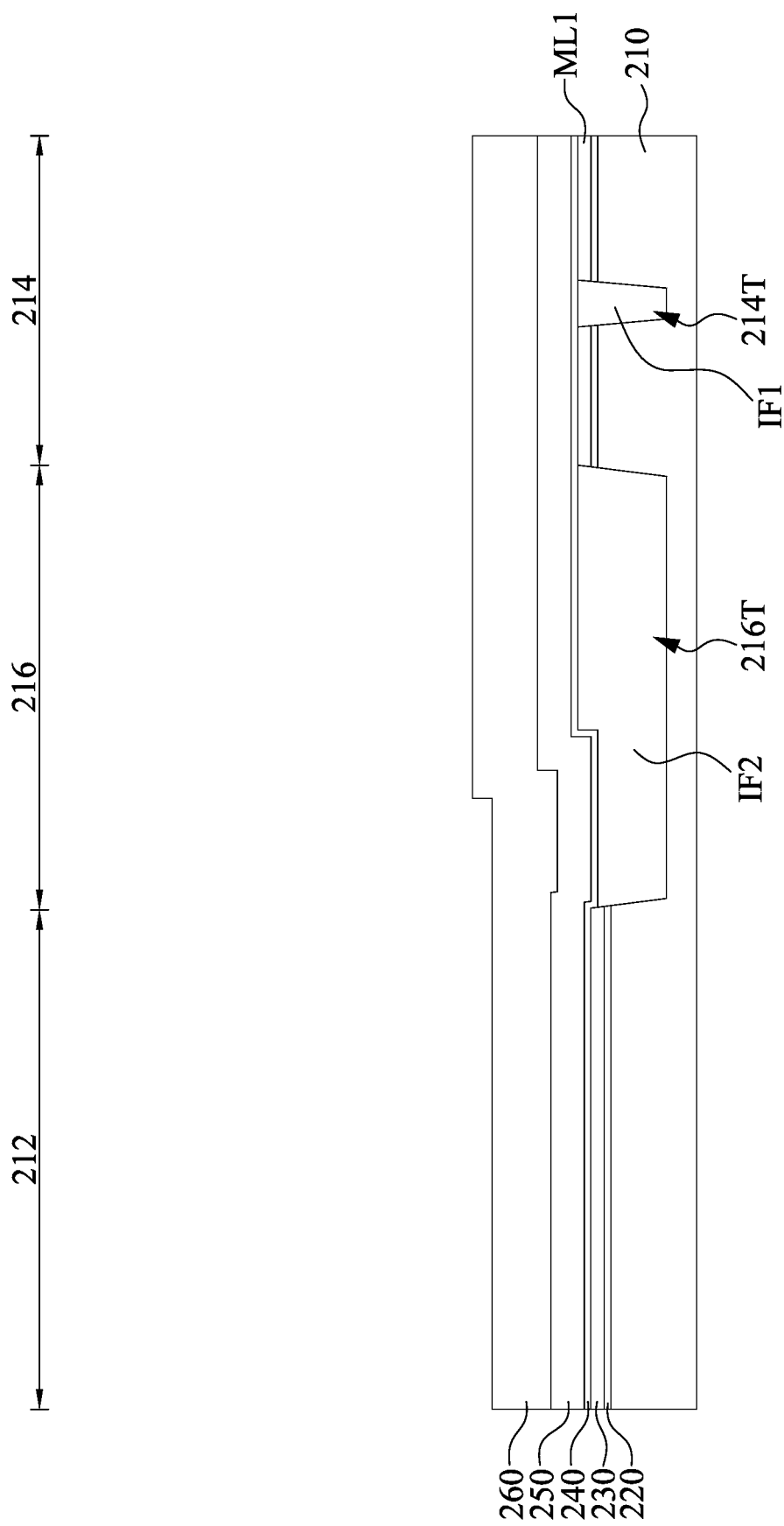

Referring to FIG. 1A and FIG. 8, the method 100 proceeds to step 114 where a blocking layer 240, a control gate layer 250, and a hard mask layer 260 are formed over the substrate 210. The blocking layer 240 is conformally formed over the floating gate layer 230. In some embodiments, the blocking layer 240 and the tunneling layer 220 may have the same materials. In other embodiments, the blocking layer 240 and the tunneling layer 220 have different materials. That is, the blocking layer 240 may include, for example, a dielectric material such as silicon dioxide ($SiO_2$), silicon nitride ($Si_3N_4$), oxynitrides (SiON), high-k materials, other non-conductive materials, or combinations thereof. The blocking layer 240 may be formed using chemical vapor deposition (CVD), physical vapor deposition (PVD), atomic layer deposition (ALD), ozone oxidation, other suitable processes, or combinations thereof.

The control gate layer 250 is conformally formed over the blocking layer 240. The control gate layer 250 may include polysilicon formed through, for example low pressure CVD (LPCVD) methods, CVD methods and PVD sputtering methods employing suitable silicon source materials. In some embodiments, the control gate layer 250 may be ion implanted. In some other embodiments, the control gate layer 250 may be made of metal, metal alloys, single crystalline silicon, or combinations thereof. In some embodiments, the control gate layer 250 is thicker than the floating gate layer 230.

The hard mask layer 260 is conformally formed over the control gate layer 250. The hard mask layer 260 may include single layer or multiple layers. In some embodiments, the hard mask layer 260 includes $SiN/SiO_2/SiN$ stacked layers or other suitable materials. In some embodiments, the hard mask layer 260 may be formed using chemical vapor deposition (CVD), physical vapor deposition (PVD), atomic layer deposition (ALD), ozone oxidation, other suitable processes, or combinations thereof.

Figure 9:
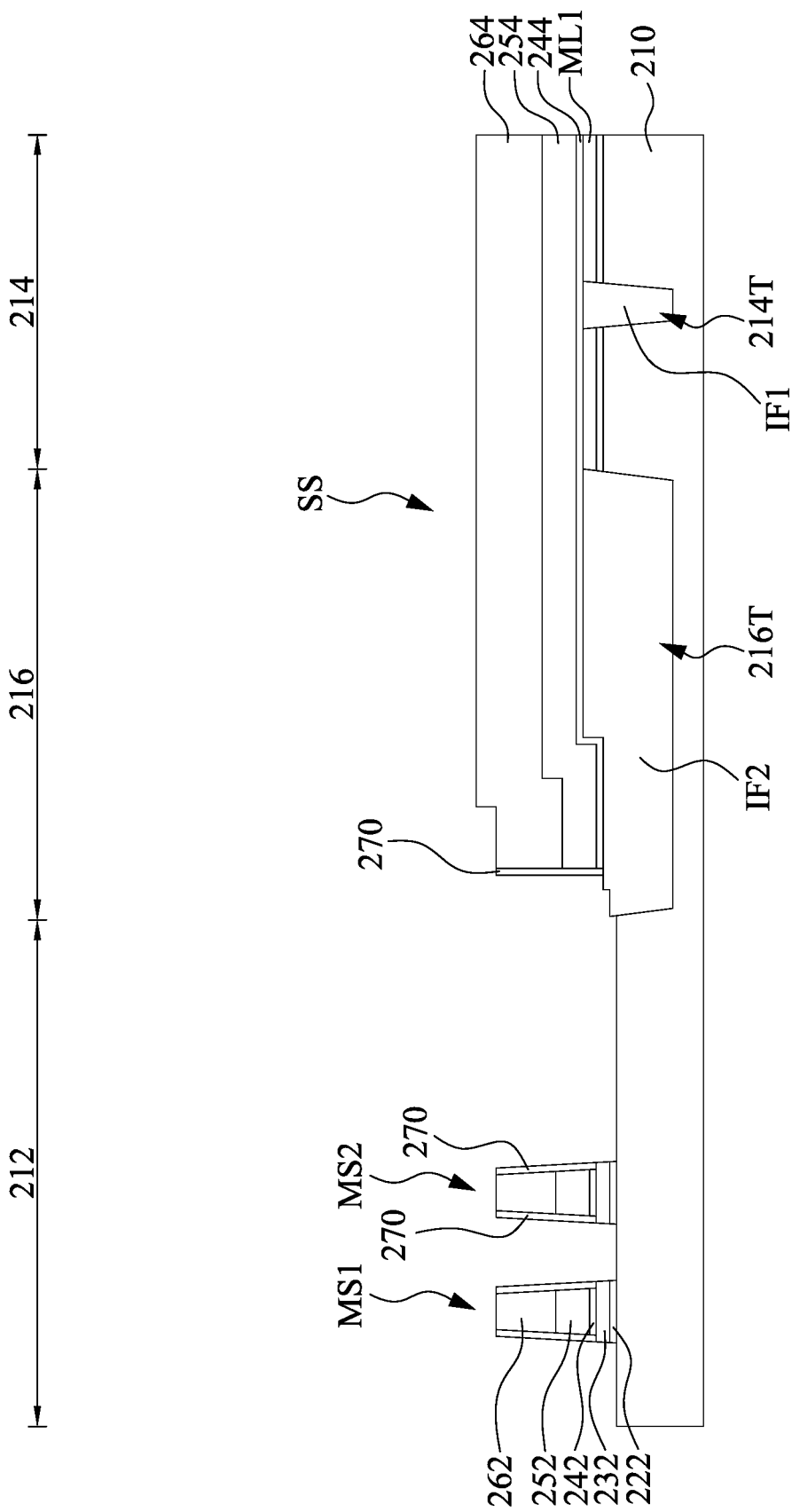

Referring to FIG. 1A and FIG. 9, the method 100 proceeds to step 116 where the hard mask layer 260, the control gate layer 250, the blocking layer 240, the floating gate layer 230, and the tunneling layer 220 are patterned to form gate stacks MS1 and MS2 over the cell region 212 of the substrate 210 and a stack SS over the peripheral region 214 and the transition region 216. In the present embodiments, the gate stacks MS1 and MS2 each include a tunneling layer 222, a floating gate 232, a blocking layer 242, a control gate 252, and a hard mask 262. The stack SS includes a blocking layer 244, a control gate 254 over the blocking layer 244, and a hard mask 264 over the control gate 254.

Specifically, the hard mask layer 260, the control gate layer 250, the blocking layer 240 are initially patterned to form the hard masks 262 and 264, the control gates 252 and 254, and the blocking layers 242 and 244, respectively. Subsequently, spacers 270 are disposed on sidewalls of the gate stacks MS1 and of the stack SS. In some embodiments, the spacers 270 are made of silicon oxide, silicon nitride, or the combination thereof. Formation of the spacers 270 includes, for example, forming a blanket layer of dielectric material over the substrate 210 and then performing an etching process to remove the horizontal portions of the blanket layer, while vertical portions of the blanket layer remain to form the spacers 270. Then, the floating gate layer 230 and the tunneling layer 220 are etched using the spacers 270 and hard masks 262 and 264 as etch masks and thus patterned into the floating gates 232 and the tunneling layers 222, respectively. Through the above operations, the gate stacks MS1 and MS2 and the stack SS are formed. In some embodiments, at least one of the gate stacks MS1 and MS2 includes a pair of the spacers 270 over the floating gate 232, and the stack SS includes a spacer 270 over the isolation feature IF2.

Figure 10:
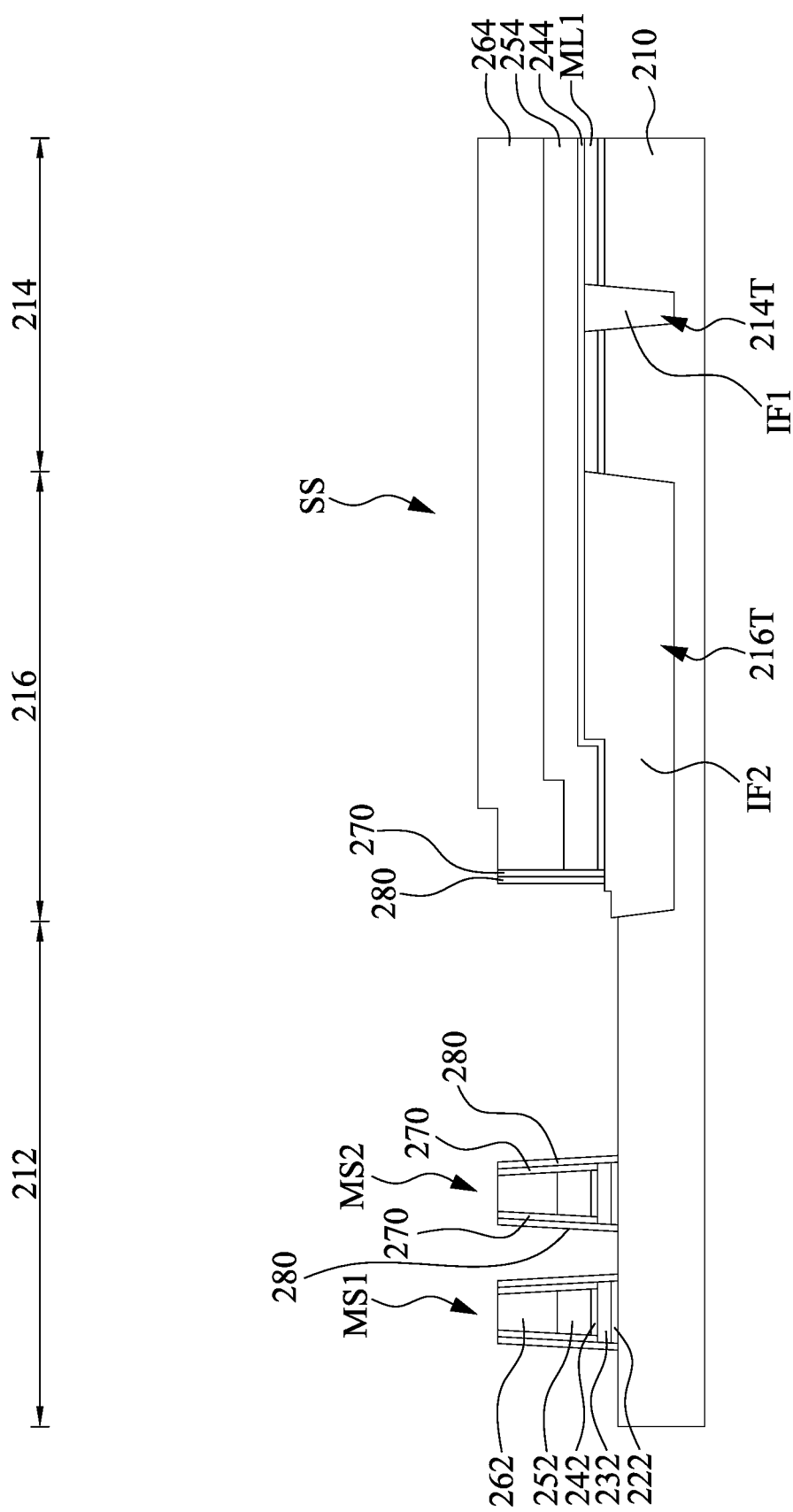

Referring to FIG. 1A and FIG. 10, the method 100 proceeds to step 118 where inter-gate dielectric layers 280 are formed on sidewalls of the spacers 270. The inter-gate dielectric layers 280 expose a portion of the semiconductor substrate 210 between the gate stacks MS1 and MS2. In some embodiments, the inter-gate dielectric layers 280 are made of oxide, the combination of oxide, nitride and oxide (ONO), and/or other dielectric materials. In some embodiments, formation of the inter-gate dielectric layers 280 includes, for example, depositing a blanket layer of dielectric material over the substrate 210 and then performing an etching process to remove the horizontal portions of the blanket layer, while remaining vertical portions of the blanket layer to serve as the inter-gate dielectric layers 280.

Figure 11:
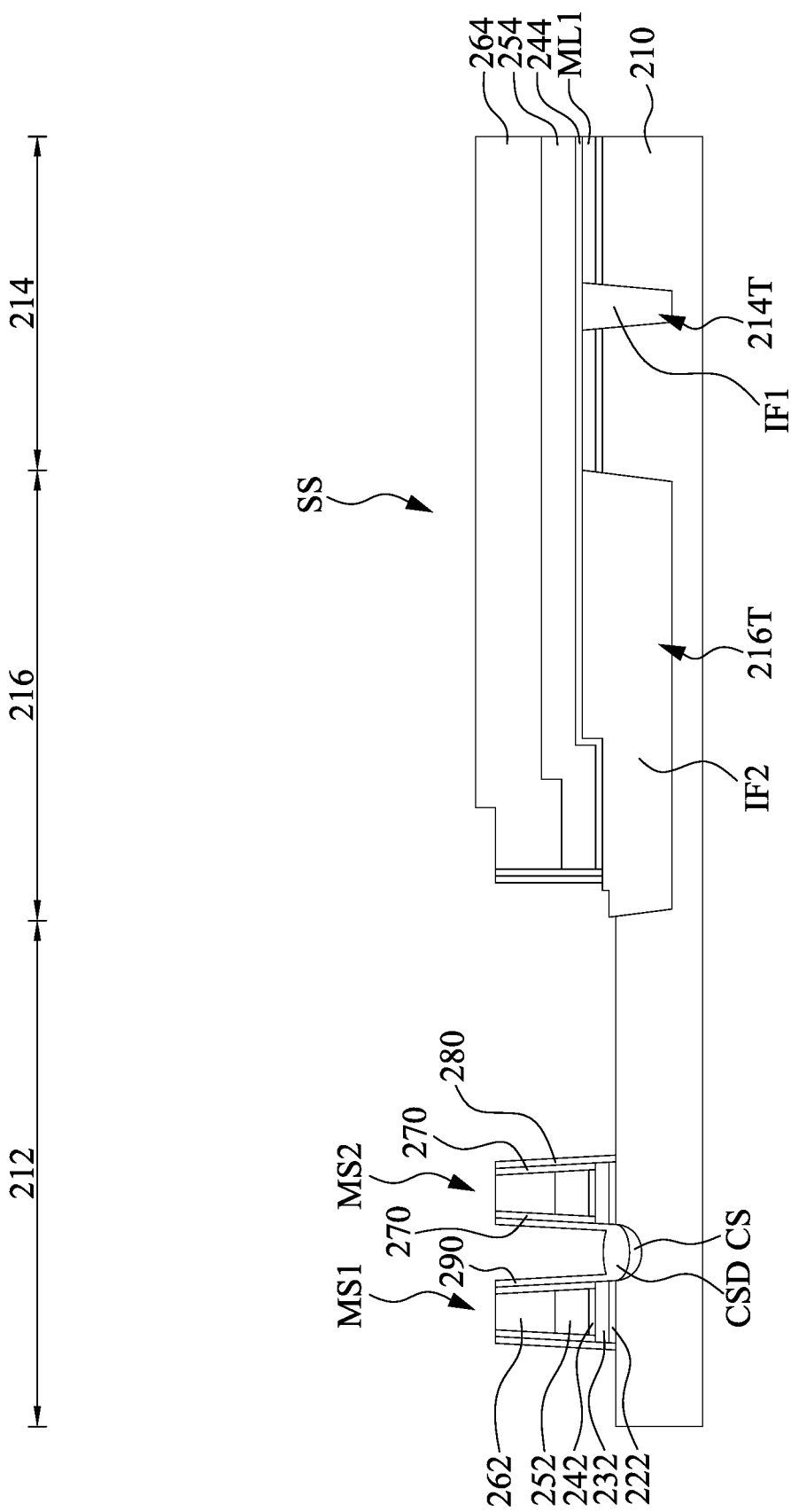

Referring to FIG. 1A and FIG. 11, the method 100 proceeds to step 120 where a common source region CS is formed in the exposed portion of the semiconductor substrate 210 between the gate stacks MS1 and MS2. For example, ions are implanted into an exposed portion of the semiconductor substrate 210 to form the common source region CS. The gate stacks MS1 and MS2 share the common source region CS.

After the implantation, a removal process or thinning process may be performed to the dielectric layers 280 between the gate stacks MS1 and MS2, such that the dielectric layers 280 between the gate stacks MS1 and MS2 are thinned or removed. Then, a common source dielectric layer CSD is formed over the source region CS using, for example, oxidation, CVD, other suitable deposition, or the like. In some embodiments, formation of the common source dielectric layer (e.g., oxidation or deposition) includes depositing a dielectric layer and etching a portion of the dielectric layer that is not between the gate stacks MS1 and MS2, such that the remaining portion of the dielectric layer forms the common source dielectric layer CSD over the common source region CS and the dielectric spacers 290 alongside the gate stacks MS1 and MS2. The common source dielectric layer CSD and the dielectric spacers 290 may be made of silicon oxide.

Figure 12:
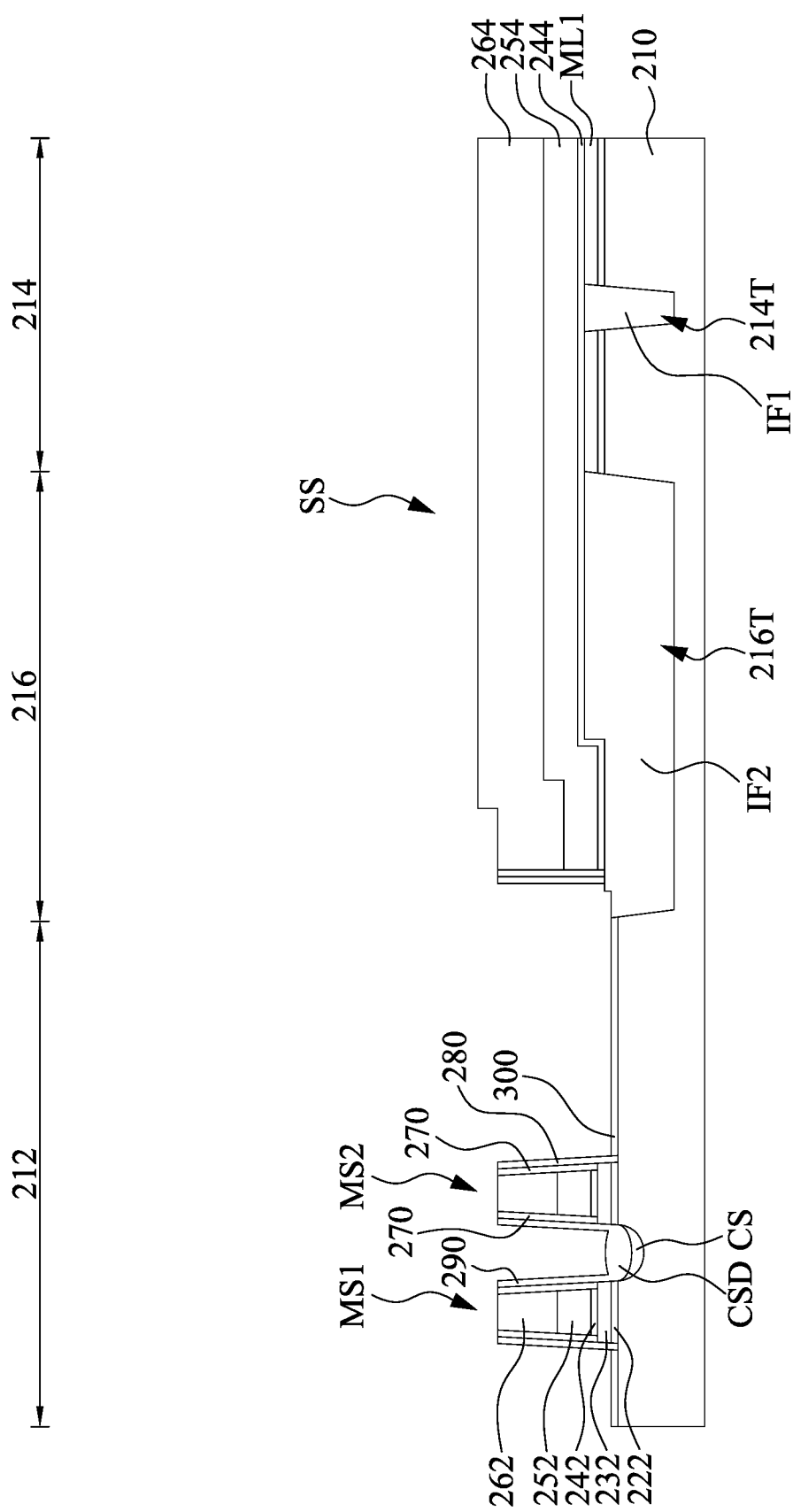

Referring to FIG. 1B and FIG. 12, the method 100 proceeds to step 122 where select gate dielectric layers 300 are formed. The select gate dielectric layer 300 may be an oxide layer or other suitable dielectric layers. For example, the select gate dielectric layer 300 is made of silicon oxide, silicon nitride, silicon oxynitride, other non-conductive materials, or the combinations thereof. In some embodiments, a thermal oxidation process is performed, such that portions of the substrate 210 uncovered by the gate stacks MS, MS2, and the common source dielectric layer CSD are oxidized to form the select gate dielectric layers 300. A thickness of the select gate dielectric layers 300 may be in a range of about 5 angstroms to about 500 angstroms for providing suitable electrical isolation between the substrate 210 and select gates formed later. In some embodiments, the thickness of the select gate dielectric layers 300 may be smaller than that of the dielectric spacers 290 and the common source dielectric layer CSD.

Figure 13:
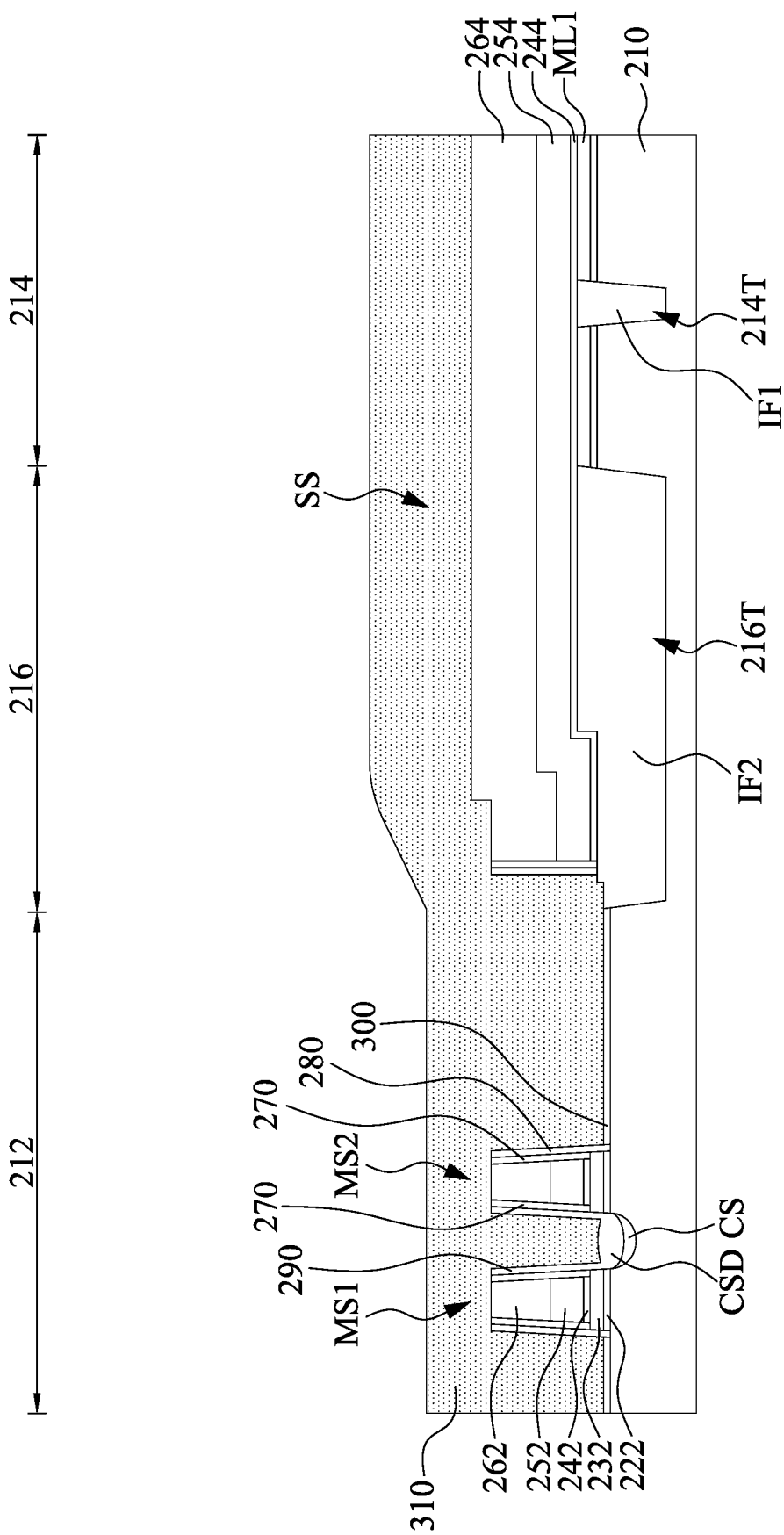

Referring to FIG. 1B and FIG. 13, the method 100 proceeds to step 124 where a conductive layer 310 is formed on the structure of FIG. 12. In some embodiments, the conductive layer 310 is made of polysilicon, other suitable conductive materials, or combinations thereof. For example, the conductive layer 310 may include doped polysilicon or amorphous silicon. The conductive layer 310 may be formed by CVD, plasma-enhanced chemical vapor deposition (PECVD), LPCVD, or other proper processes.

Figure 14:
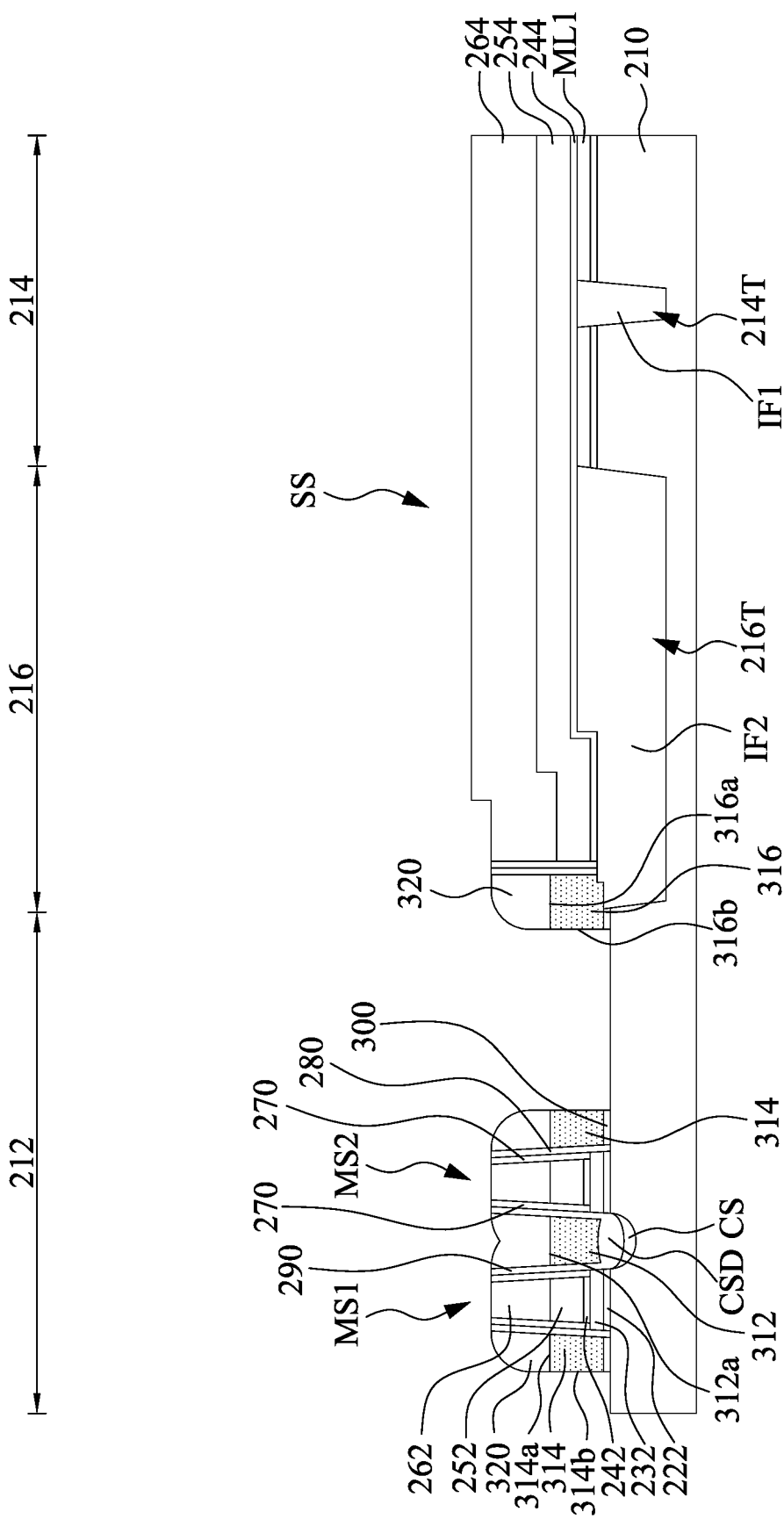

Referring to FIG. 1B and FIG. 14, the method 100 proceeds to step 126 where the conductive layer 310 (referring to FIG. 13) is patterned to form an erase gate 312 between the gate stacks MS1 and MS2, select gates 314 on sides of the gate stacks MS1 and MS2, and a dummy gate 316 on a side of the stack SS. In some embodiments, the select gates 314 may be referred to as word lines. For example, referring to FIGS. 13 and 14, the conductive layer 310 is etched back first, then, plural hard masks 320 are formed over the conductive layer 310, and an etching process is performed to pattern the conductive layer 310 using the hard masks 320 as etching masks to form the erase gate 312, the select gates 314, and the dummy gate 316. Herein, the erase gate 312 is formed over the common source dielectric layer CSD, and the select gates 314 and the dummy gate 316 are formed over the select gate dielectric layers 300. Arranged between the select gates 314 and the semiconductor substrate 210, the select gate dielectric layer 300 provides electrical isolation therebetween. In some embodiments, the configuration of the dummy gate 316 can improve the cell uniformity.

Herein, a top surface 312a of the erase gate 312, top surfaces 314a of the select gates 314, and a top surface 316a of the dummy gate 316 are covered by the hard masks 320, and side surfaces 314b of the select gates 314 and a side surface 316b of the dummy gate 316 are exposed by the hard masks 320.

Figure 15:
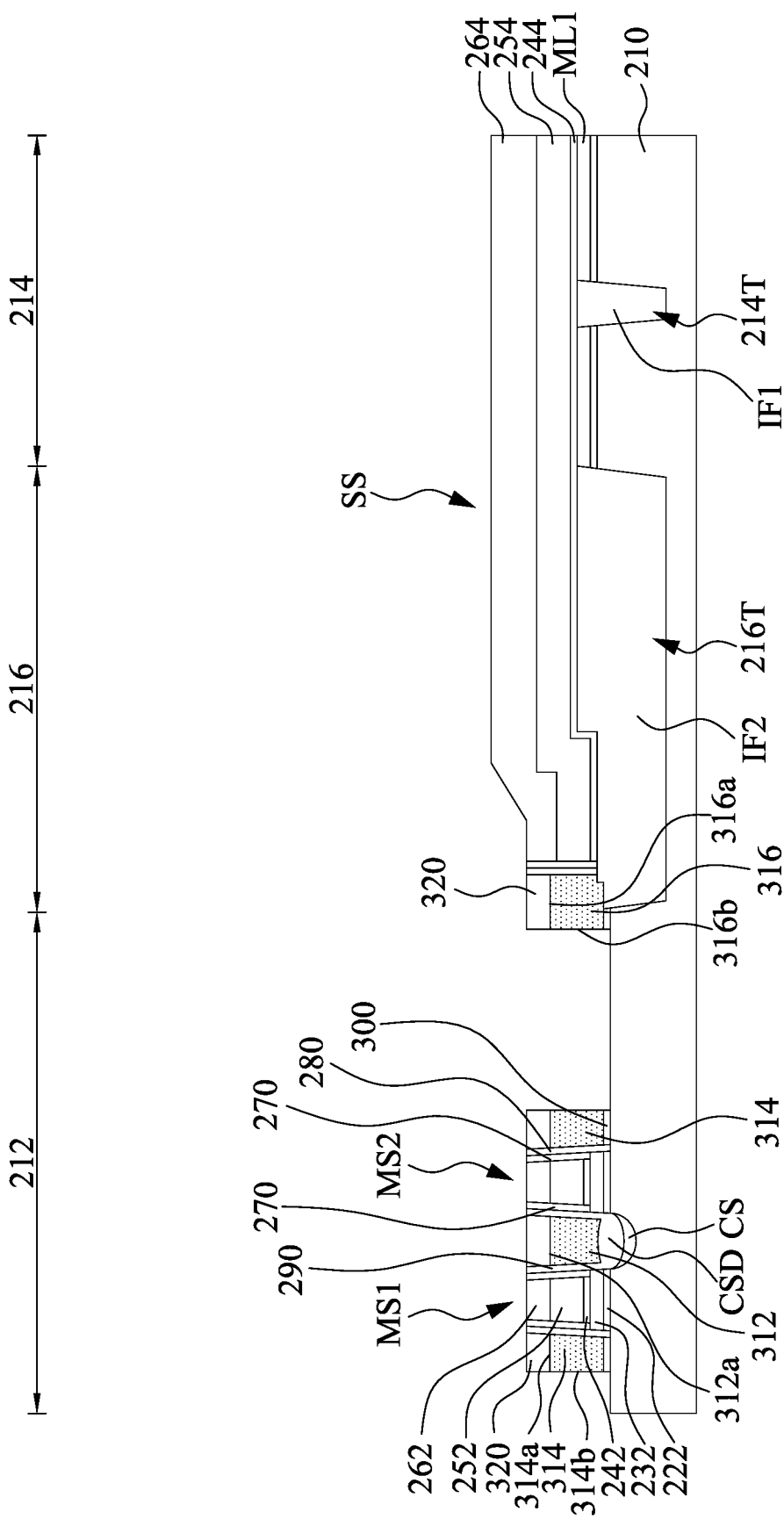

Referring to FIG. 1B and FIG. 15, the method 100 proceeds to step 128 where the hard masks 262, 264, and 320 are etched back, and the height of the stacks in the cell region 212 is reduced. In some embodiments, prior to the etching back, a flowable material (i.e., an organic material) is formed on the structure of FIG. 14. Due to the good flowability of the flowable material, the substrate 210 uncovered by the hard masks 262, 264, and 320 are covered by thicker flowable material, thereby the substrate 210 uncovered by the hard masks 262, 264, and 320 are prevented from being damaged during the etch back process. The etch back process may also remove the flowable material.

Figure 16:
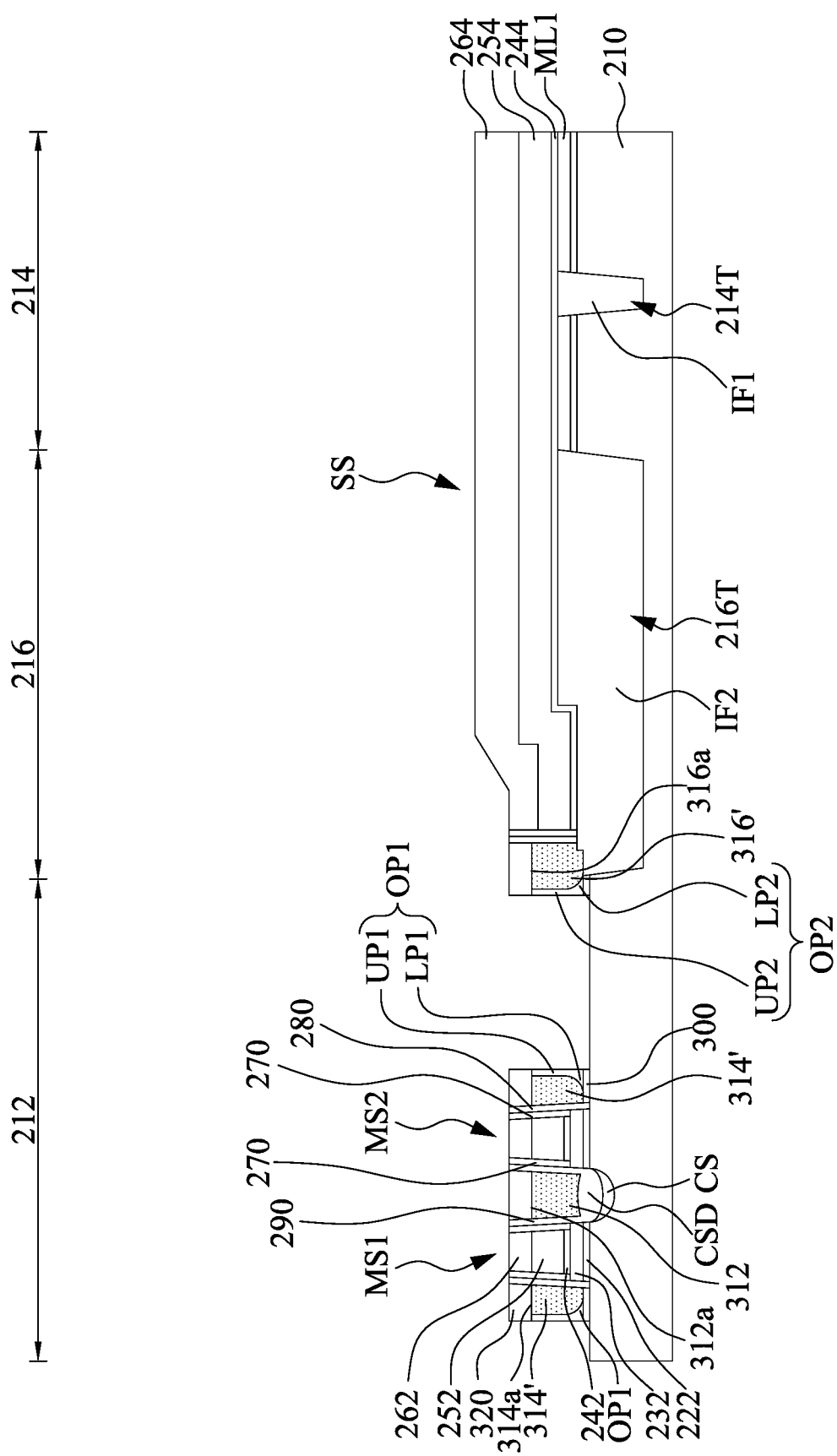

Referring to FIG. 1B and FIG. 16, the method 100 proceeds to step 130 where portions of the select gates 314 (referring to FIG. 14) are oxidized to form oxide portions OP1, while remaining portions of the select gates 314 (referring to FIG. 14) are left conductive. The remaining portions of the select gates 314 (referring to FIG. 14) are referred to as the select gates 314' hereinafter. To be specific, oxidation process (e.g., wet oxidation or thermal oxidation) is performed to the exposed side surface 314b of the select gates 314 (referring to FIG. 14), such that a portion of at least one of the select gates 314 (referring to FIG. 14) adjacent to the exposed side surface 314b is turned into the oxide portion OP1. In some embodiments, the patterning/etching process to form the select gates 314 as shown in FIG. 14 results in more defects in lower regions of the select gate 314 than in upper regions of the select gates 314. The defect difference results in different oxidation rates between the upper and lower regions of the select gates 314, which in turn results in different profiles between an upper portion UP1 and a lower portion LP1 of the oxide portion OP1. For example, the lower oxide portion LP1 is thicker than the upper oxide portion UP1 because the lower region of the select gate 314 has a higher oxidation rate than the upper region of the select gate 314. In some embodiments, an inner surface of the oxide portion OP1 may be curved due to the oxidation difference as discussed above. Because the oxide portion OP1 is in contact with the select gate 314, the oxide portion OP1 and the select gate 314 form a curved interface.

Similarly, a portion of the dummy gate 316 (referring to FIG. 14) adjacent to the exposed side surface 316b may be oxidized to form an oxide portion OP2, while a remaining portion of the dummy gate 316 (referring to FIG. 14) is left conductive. The remaining portion of the dummy gate 316 (referring to FIG. 14) is referred to as the dummy gate 316' hereinafter. Similar to the shape of the oxide portion OP1, the oxide portion OP2 may have an upper portion UP2 and a lower portion LP2 thicker than the upper portion UP2, and an inner surface of the oxide portion OP2 may be curved. In some embodiments, the thickness of the lower portions LP1 and LP2 of the oxide portion OP1 and OP2 may be in range from 5 angstroms to about 100 angstroms. The select gates 314' and the dummy gates 316' have a higher conductance than that of the oxide portions OP1 and OP2. In some embodiments where the select gates 314' and the dummy gate 316' are made of polysilicon, and the oxide portions OP1 and OP2 are formed of silicon oxide.

Because the select gate dielectric layer 300 and the oxide portion OP1 are arranged between the select gates 314' and the semiconductor substrate 210, the select gate dielectric layer 300 and the oxide portion OP1 provides electrical isolation therebetween. The materials of the oxide portions OP1 and the select gate dielectric layer 300 may be different. For example, the oxide portions OP1 may be made of silicon oxide, and the select gate dielectric layer 300 may be made of silicon oxynitride. In some other embodiments, materials of the oxide portions OP1 and the select gate dielectric layer 300 may be the same. For example, the oxide portions OP1 and the select gate dielectric layer 300 may be made of silicon oxide.

Figure 17:
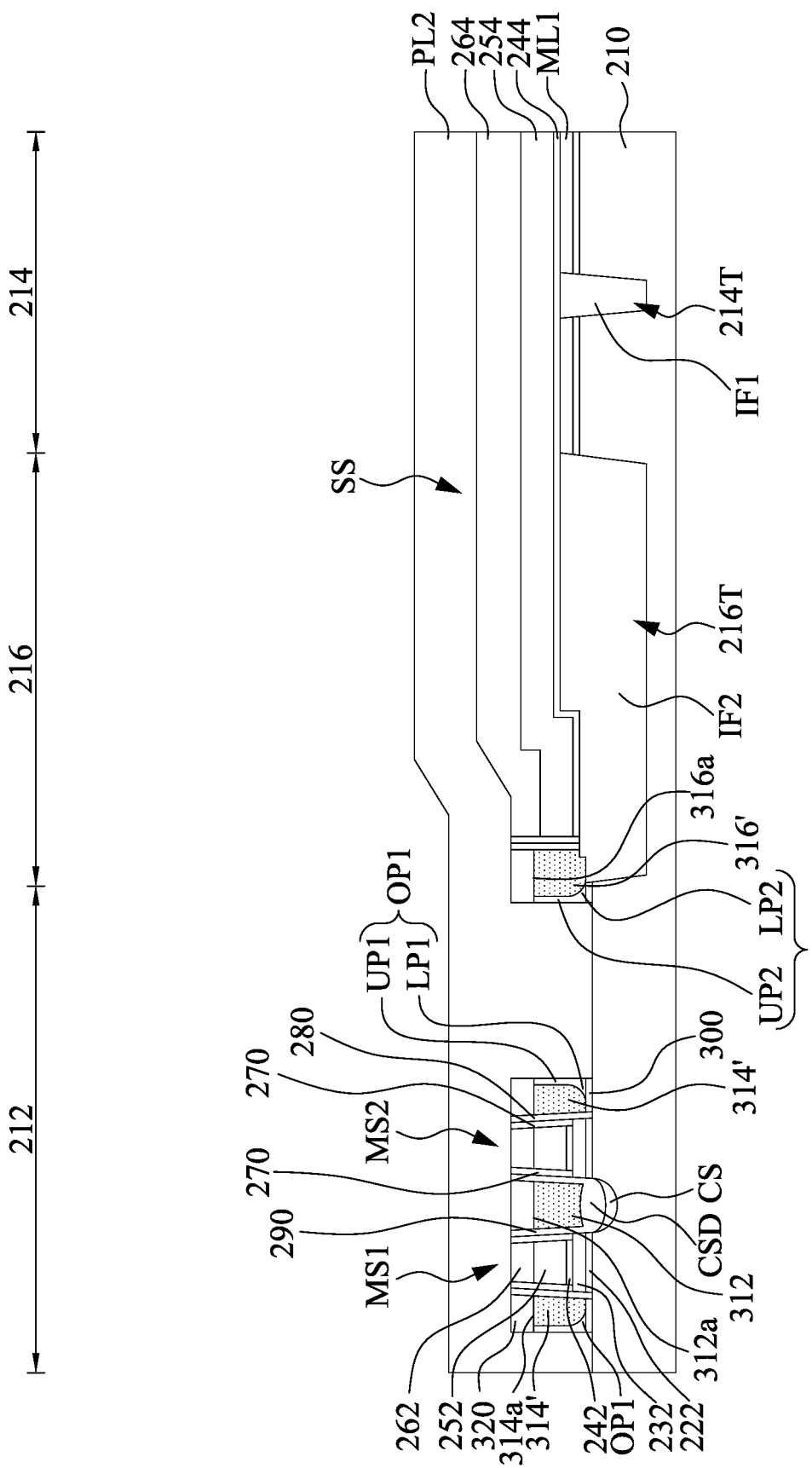

Referring to FIG. 1B and FIG. 17, the method 100 proceeds to step 132 where a protective layer PL2 is formed over the stack SS and the gate stacks MS1 and MS2. In some embodiments, the protective layer PL2 is, for example, made of amorphous silicon, polysilicon, silicon oxide, silicon nitride, silicon oxynitride, other suitable materials, or the combinations thereof. The protective layer PL2 may be formed by suitable deposition methods, such as CVD or the like. In some embodiments, prior to deposition of the protective layer PL2, a cleaning process may be performed to remove particles on the substrate. In some embodiments, the cleaning process may thin or even remove the upper portions UP1 and UP2 of the oxide portions OP1 and OP2. For example, the oxide portions OP1 and OP2 may become thinner by about 0 angstrom to about 70 angstroms.

Figure 18:
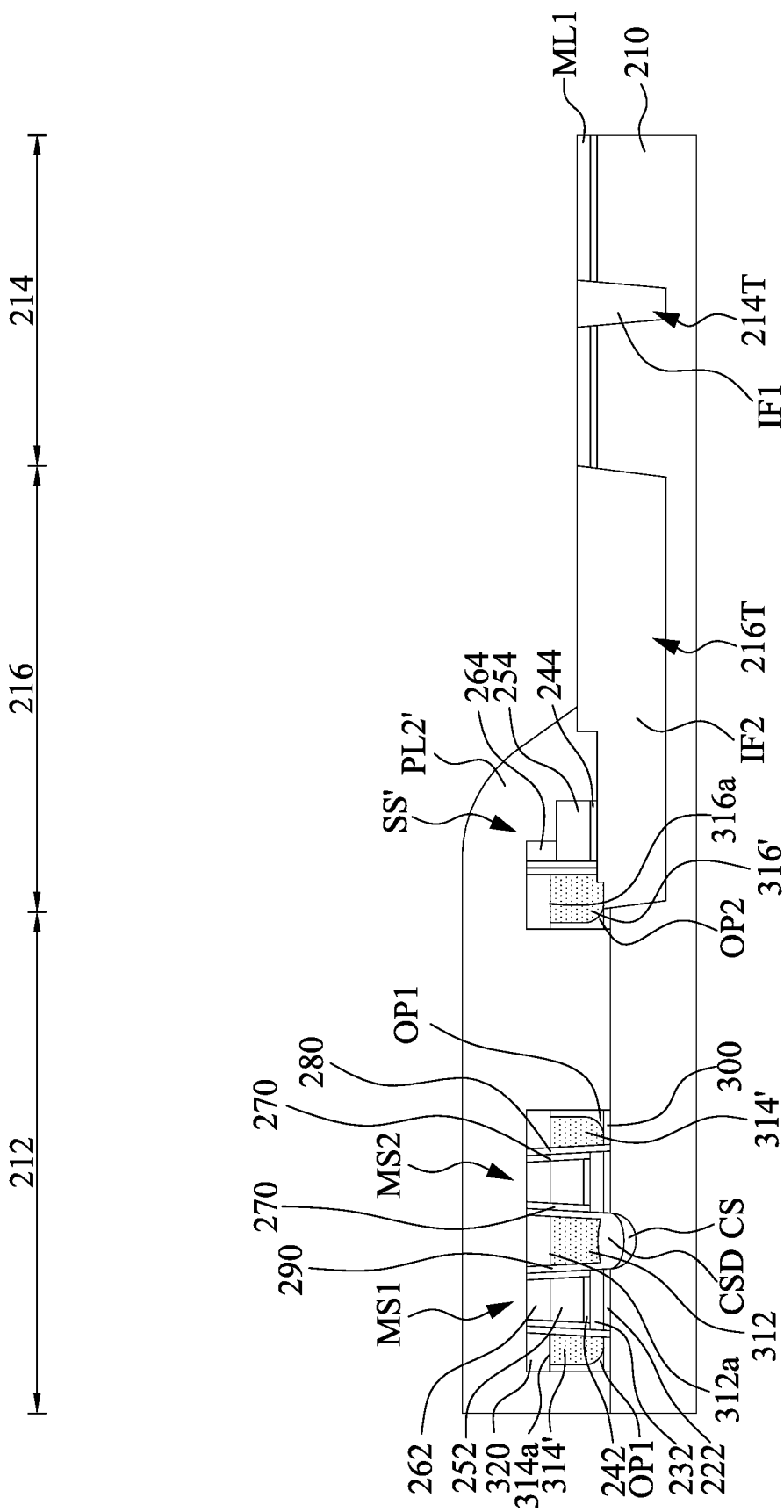

Referring to FIG. 1B and FIG. 18, the method 100 proceeds to step 134 where an etching process is performed to remove a portion of the stack SS over the peripheral region 214 and the transition region 216, and a remaining portion of the stack SS is referred to as the stack SS' hereinafter. For example, a photoresist mask is formed on the protective layer PL2 over the cell region 212 and a portion of the transition region 216, and a portion of the protective layer PL2 over the other portion of the transition region 216 and the peripheral region 214 is exposed from the photoresist mask. Then, an etching process is performed to remove the exposed portion of the protective layer PL2 and the underlying portions of the hard mask 264, the control gate 254, and the blocking layer 244. After the etching process, the stack SS' remains over the transition region 216 and a portion of the protective layer PL2 remains over the stack SS'. After the etching process, a protective material (e.g., amorphous silicon, polysilicon, silicon oxide, silicon nitride, silicon oxynitride, other suitable materials, or the combinations thereof) is blanket formed over the substrate 210, and an etching back process is performed to the protective material to form the protective layer PL2' including the remaining portion of the protective layer PL2. The protective layer PL2' may have a tapered profile and cover the stack SS' and the gate stacks MS1 and MS2 for protecting the stack SS', and the protective layer PL2' exposes the portion of the transition region 216 and all the peripheral region 214.

Figure 19:
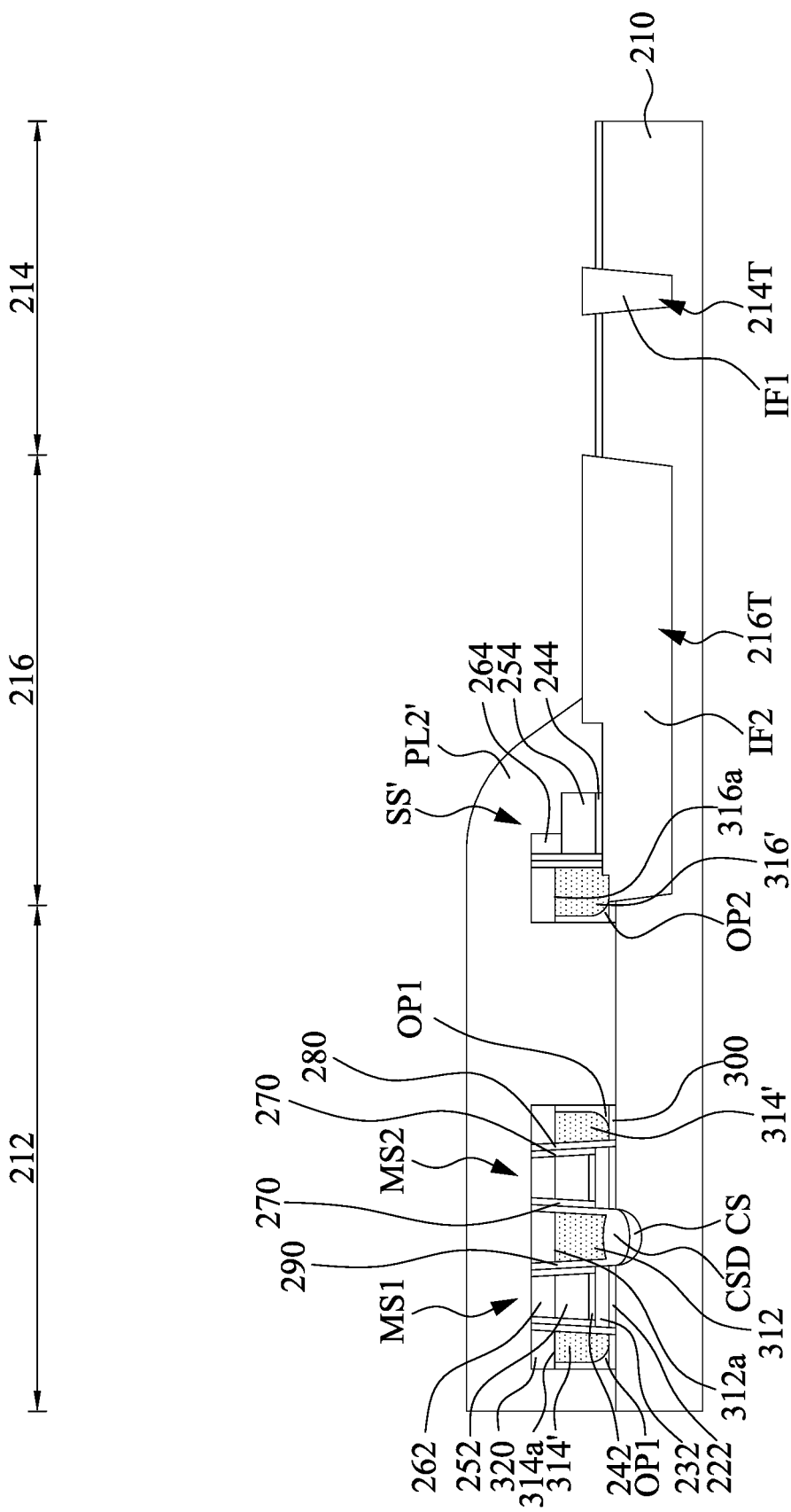

Referring to FIG. 1B and FIG. 19, the method 100 proceeds to step 136 where the mask layer ML1 (referring to FIG. 18) over the peripheral region 214 is removed through a suitable etching process, while the stack SS' and the gate stacks MS1 and MS2 remain intact because of the protection of the protective layer PL2'. For example, an etch process is performed, and the protective layer PL2' has a higher etch resistance than that of the mask layer ML1, such that the mask layer ML1 is removed while the protective layer PL2' remains intact.

Figure 20:
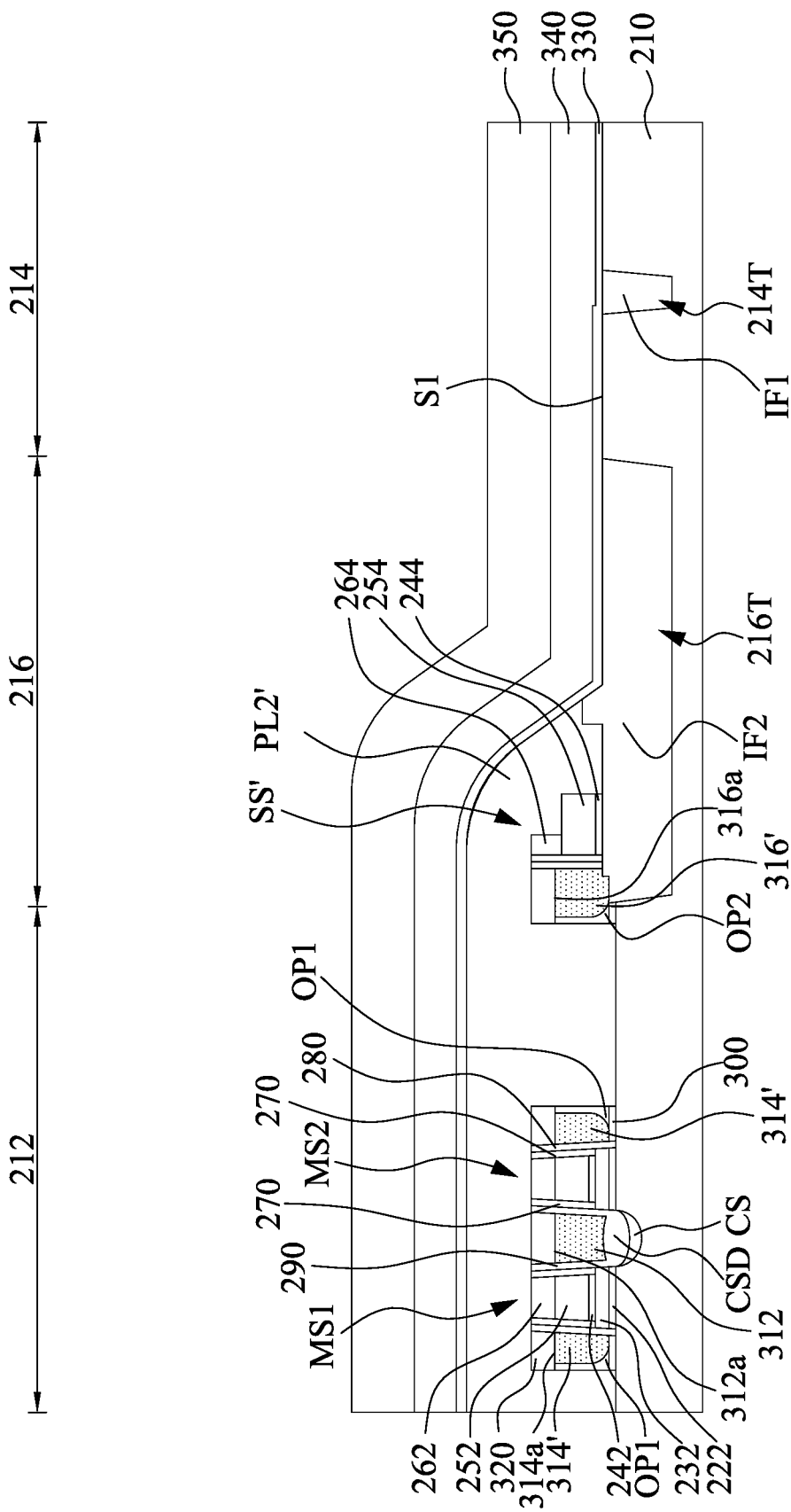

Referring to FIG. 1B and FIG. 20, the method 100 proceeds to step 138 where a gate dielectric layer 330, a gate electrode layer 340, and a hard mask layer 350 are formed. Herein, one or more processes (e.g., one or more lithography and etching processes) are initially performed to remove protruding portions of the isolation features IF1 and IF2, such that a planar surface S1 is yielded in the peripheral region 214 and a portion of the transition region 216. Subsequently, the gate dielectric layer 330, the gate electrode layer 340, and the hard mask layer 350 are formed in sequence over the protective layer PL2' and the planar surface S1. The gate dielectric layer 330 may be made of suitable high-k materials, other non-conductive materials, or combinations thereof. Examples of the high-k material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The gate electrode layer 340 may be made of conductive materials, such as a polysilicon layer. The hard mask layer 350 may be made of silicon nitride or other suitable materials.

In some embodiments, the gate dielectric layer 330 may be thicker in a region where high voltage devices are to be formed, and be thinner in a region where low voltage devices are to be formed. Therefore, the gate dielectric layer 300 has a thick region and a thin region thinner than the thick region. Exemplary method for achieving the difference thicknesses may include conformally forming a gate dielectric layer, masking a first region of the gate dielectric layer while unmasking a second region of the gate dielectric layer, and thinning (e.g., etching) the second region of the gate dielectric layer. The resulting second region is thus thinner than the first region.

Figure 21:
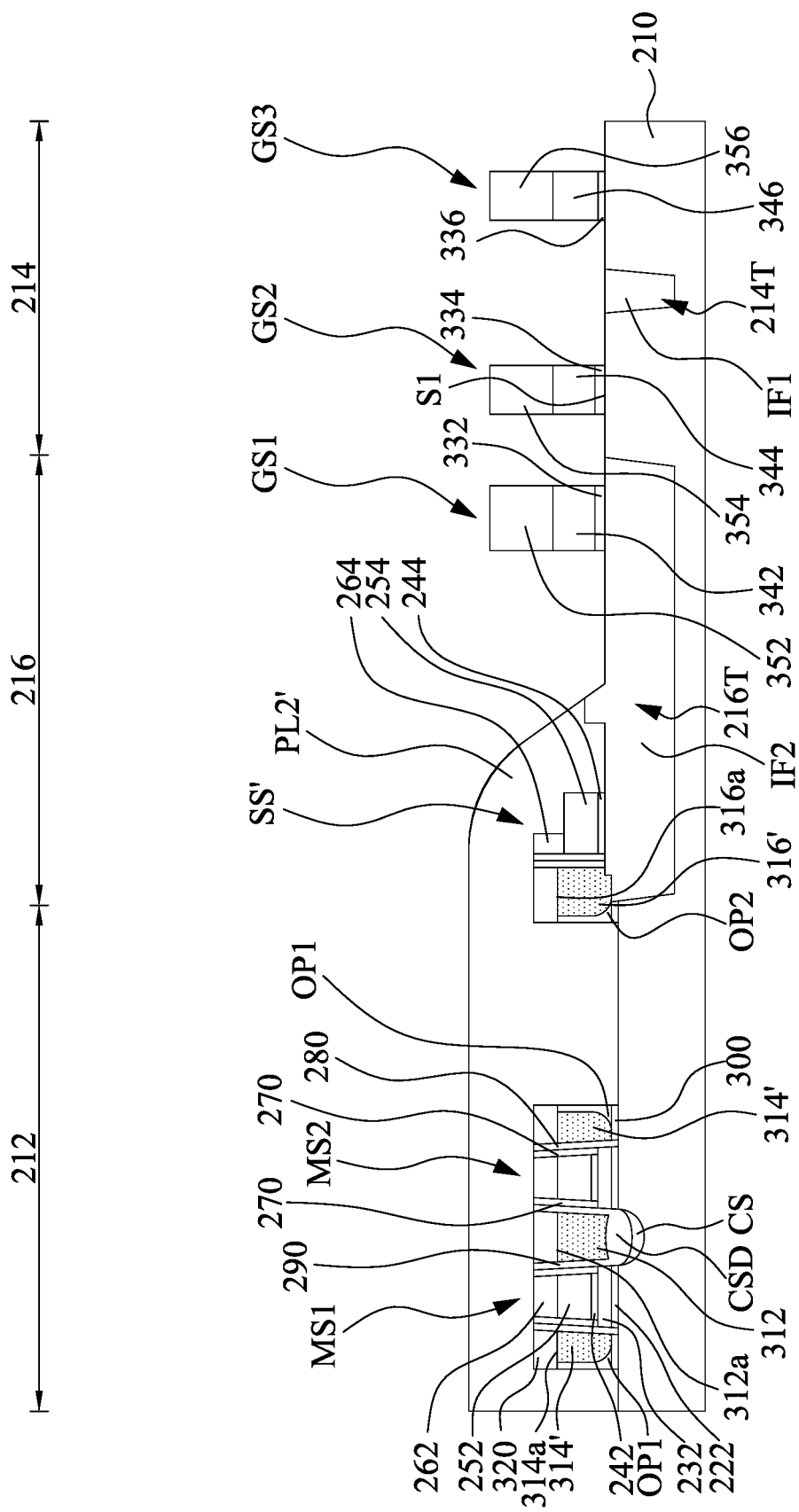

Referring to FIG. 1B and FIG. 21, the method 100 proceeds to step 140 where the gate electrode layer 340 is patterned into gate electrodes 342, 344, and 346, the hard mask layer 350 is patterned into hard masks 352, 354, and 356 over the gate electrodes 342, 344, and 346 respectively, and the gate dielectric layer 330 is patterned into gate dielectrics 332, 334, and 336. The patterning involves, for example, suitable lithography and etching processes.

Through the configuration, a dummy gate stack GS1 is formed over the exposed transition region 216, and a high voltage gate stack GS2 and a logic gate stack GS3 are formed over the peripheral region 214. The dummy gate stack GS1 has a gate dielectric 332, a gate electrode 342 over the gate dielectric 332, and a hard mask 352 over the gate electrode 342. The high voltage gate stack GS2 has a gate dielectric 334, a gate electrode 344 over the gate dielectric 334, and a hard mask 354 over the gate electrode 344. The logic gate stack GS3 has a gate dielectric 336, a gate electrode 346 over the gate dielectric 336, and a hard mask 356 over the gate electrode 346.

In some embodiments, the gate dielectric layer 330 may have a thick region and a thin region thinner than the thick region. An example method of forming thick and thin regions in the gate dielectric layer 330 includes suitable deposition, lithography and etching techniques as discussed previously with respect to the description of the gate dielectric layer 330. After patterning the gate dielectric layer 330, the thick region of the gate dielectric layer 330 remains and serves as the gate dielectric 334 of the high voltage gate stack GS2, and the thin region of the gate dielectric layer 330 remains and serves as the gate dielectric 336 of logic gate stack GS3. As a result, the gate dielectric 334 is thicker than the gate dielectric 336. Through the configuration, compared with the logic gate stack GS3 that operates in a relative low voltage, the gate dielectric 334 can withstand a high voltage operation of the high voltage gate stack GS2.

Figure 22:
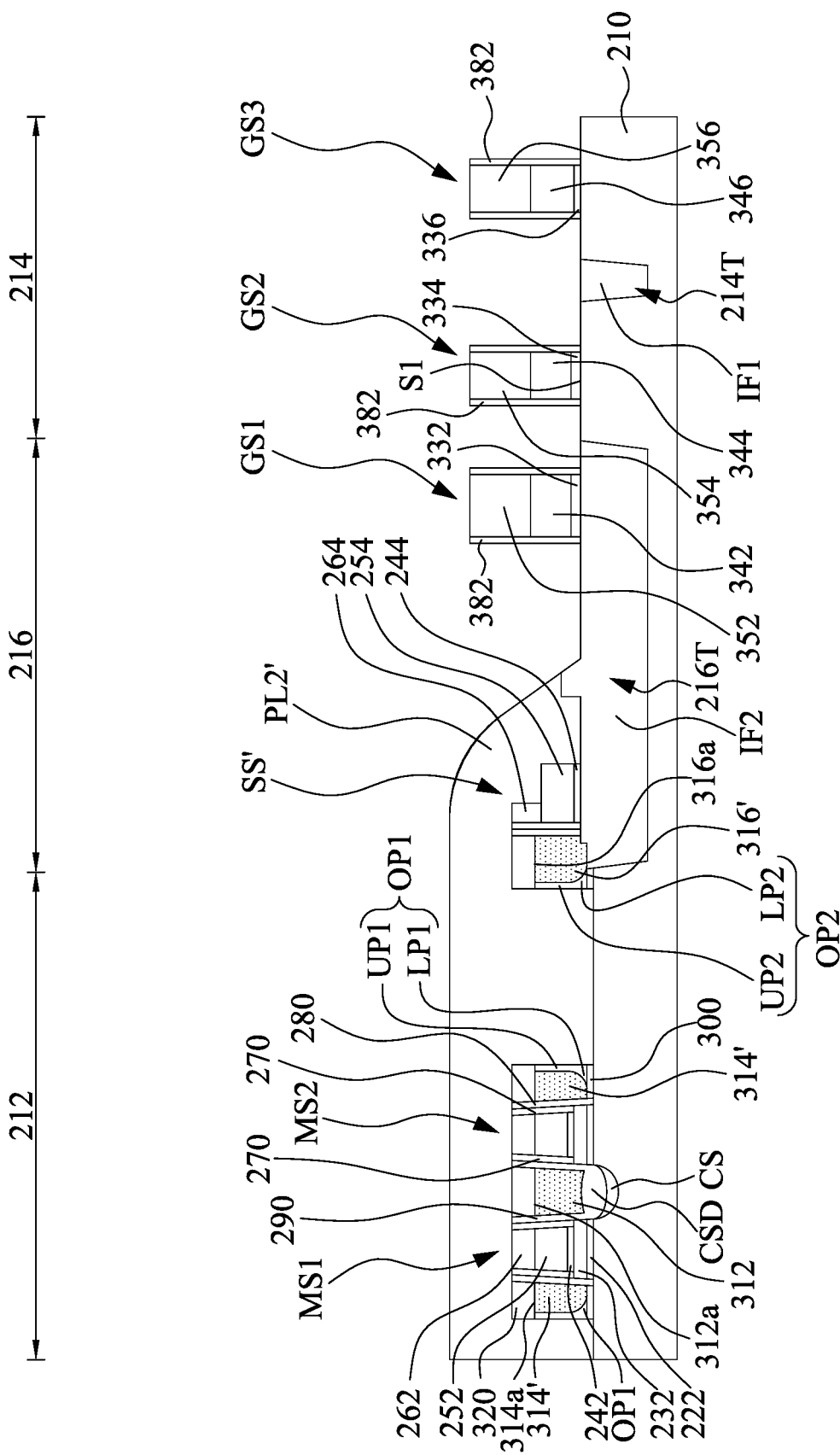

Referring to FIG. 1B and FIG. 22, seal layers 382 are formed on opposite sidewalls of the dummy gate stack GS1, the high voltage gate stack GS2, and the logic gate stack GS3. For example, a dielectric seal layer may be conformally formed over the structure of FIG. 21, and an etching process (e.g. anisotropic etching process) is performed to remove horizontal portions of the dielectric seal layer, and vertical portions of the dielectric spacer layer remain to form the seal layers 382. The seal layers 382 may be made of silicon nitride or other suitable materials.

Figure 23:
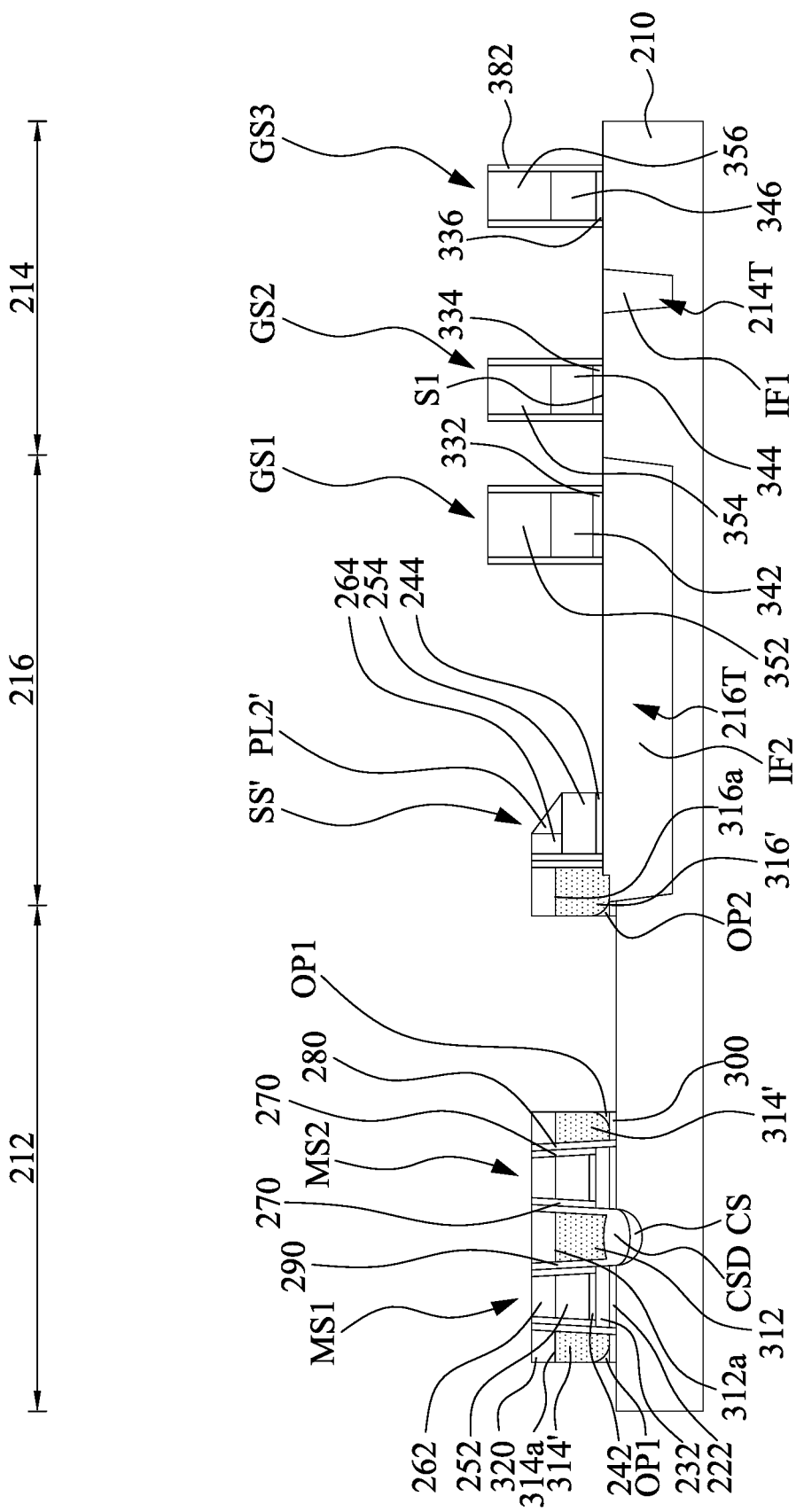

Referring to FIG. 1B and FIG. 23, the method 100 proceeds to step 142 where the protective layer PL2' over the cell region 212 and the transition region 216 are removed, such that the gate stacks MS1 and MS2 and the stack SS' are exposed. Herein, one or more suitable etching processes are performed to remove the protective layer PL2'. In some embodiments, a portion of the protective layer PL2' may remain on a side of the stack SS'. In some embodiments, the etching processes may also thin the oxide portions OP1 and OP2. For example, the etching process may thin the lower portions LP1/LP2 of the oxide portions OP1 and OP2, and remove the upper portions UP1 and UP2 of the oxide portions OP1 and OP2, such that sidewalls of the select gates 314' and the dummy gate 316' are exposed.

Figure 24:
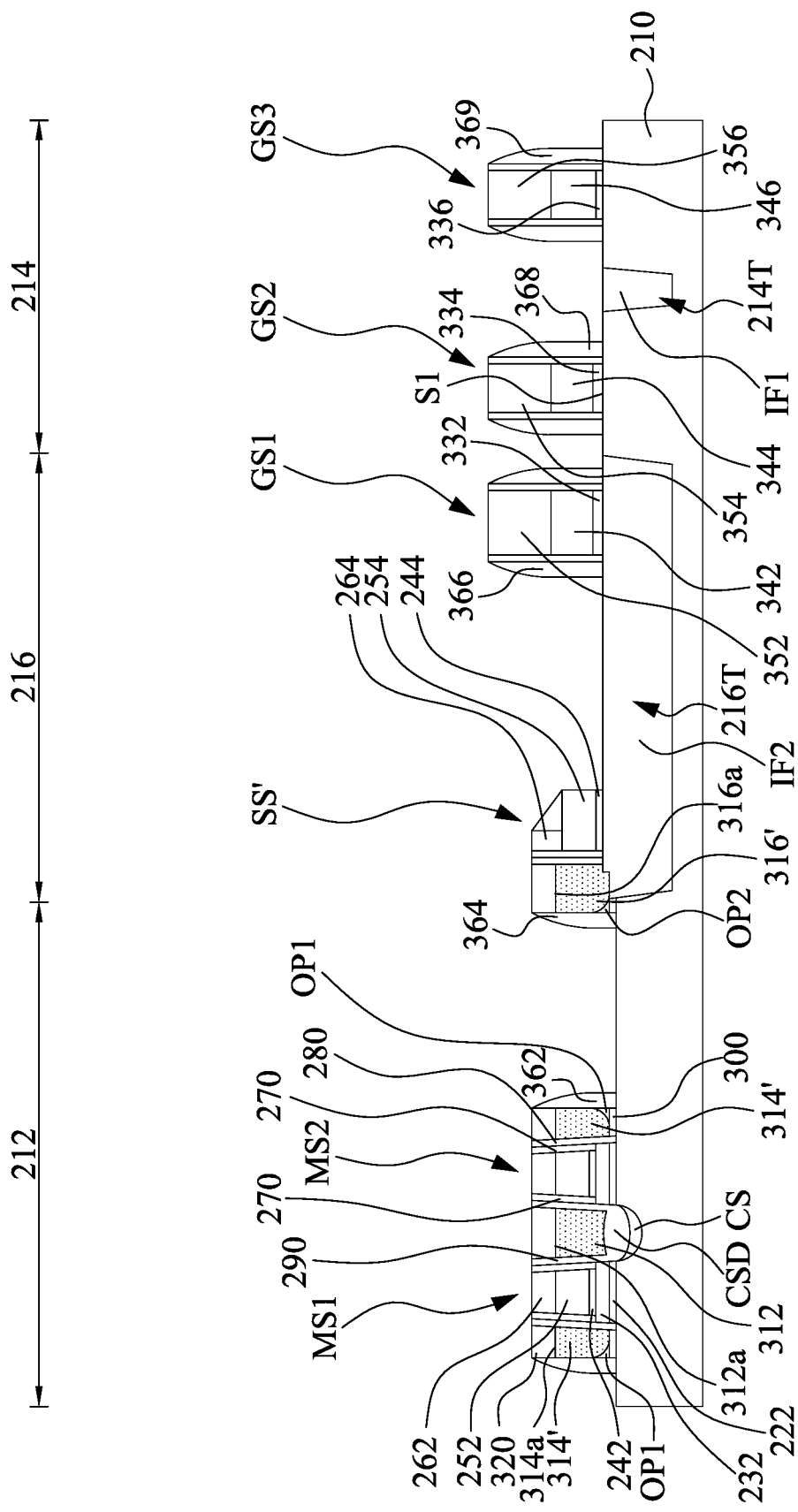

Referring to FIG. 1B and FIG. 24, the method 100 proceeds to step 144 where spacers 362, 364, 366, 368, and 369 are formed. To be specific, the spacers 362 are formed on the sidewalls of the select gates 314' away from the gate stacks MS1 and MS2. The spacer 364 is formed on a sidewall of the dummy gate 316' away from the stack SS'. The spacers 366 are formed on opposite sidewalls of the gate stack GS1. Spacers 368 are formed on opposite sidewalls of the gate stack GS2. Spacers 369 are formed on opposite sidewalls of the gate stack GS3.

For example, a dielectric spacer layer may be conformally formed over the structure of FIG. 23, and an etching process (e.g. anisotropic etching process) is performed to remove horizontal portions of the dielectric spacer layer, and vertical portions of the dielectric spacer layer remain to form the spacers 362, 364, 366, 368, and 369. The spacers 362, 364, 366, 368, and 369 may be made of silicon nitride, silicon oxide, and/or other dielectric materials, or the combinations thereof.

Figure 25:
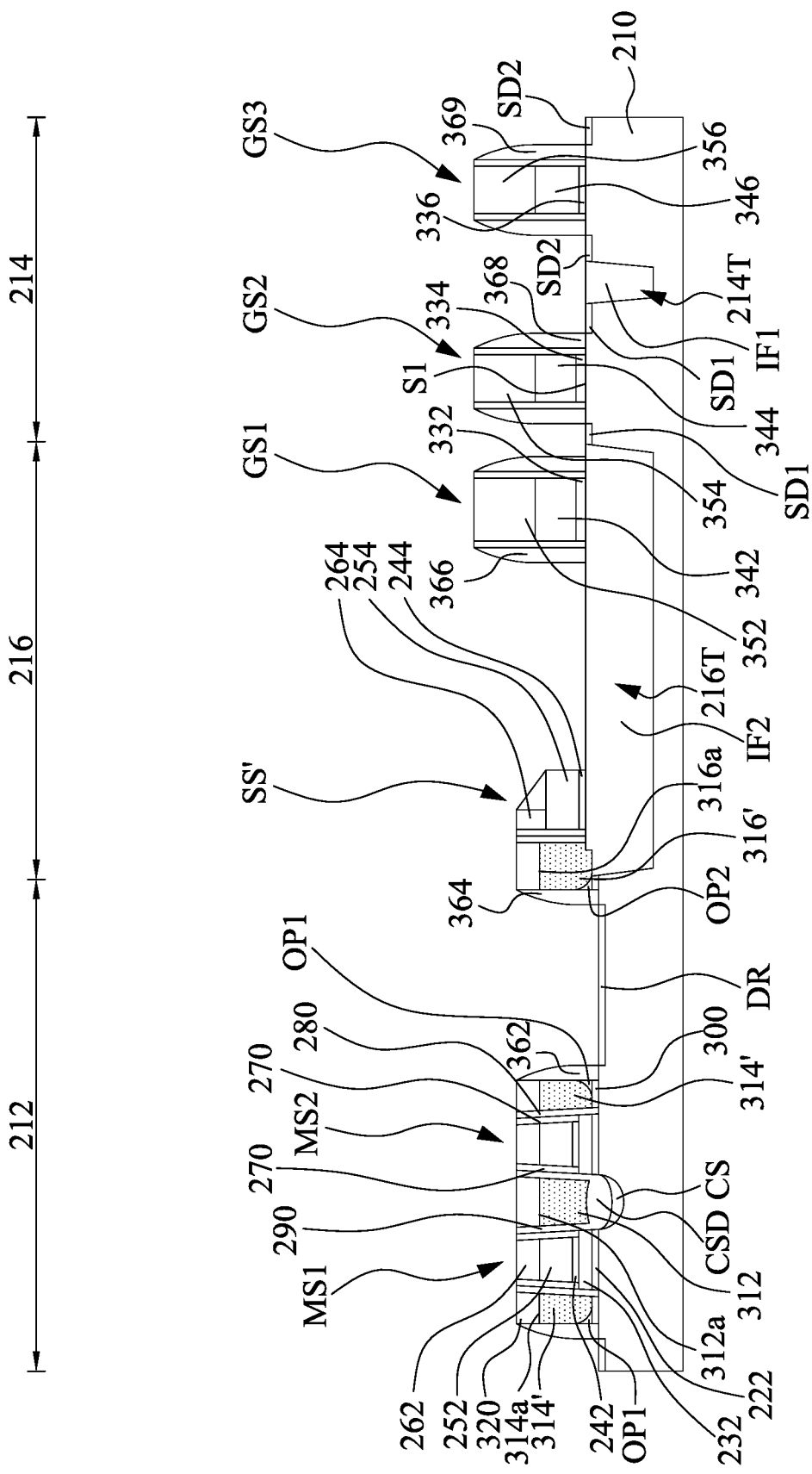

Referring to FIG. 1B and FIG. 25, the method 100 proceeds to step 146 where drain regions DR are formed in the cell region 212 of the semiconductor substrate 210 and source/drain regions SD1 and SD2 are formed in the peripheral region 214 of the semiconductor substrate 210. In some embodiments, the drain regions DR and the source/drain regions SD1 and SD2 are formed by performing an ion implantation process to the substrate 210. The select gates 314' and the dummy gate 316' are protected by the spacers 362 and 364 during the ion implantation process. In some embodiments, an optional silicide layer is formed on the drain regions DR and the source/drain regions SD1 and SD2 using for example, reacting metal with the drain regions DR and the source/drain regions SD1 and SD2.

Figure 26:
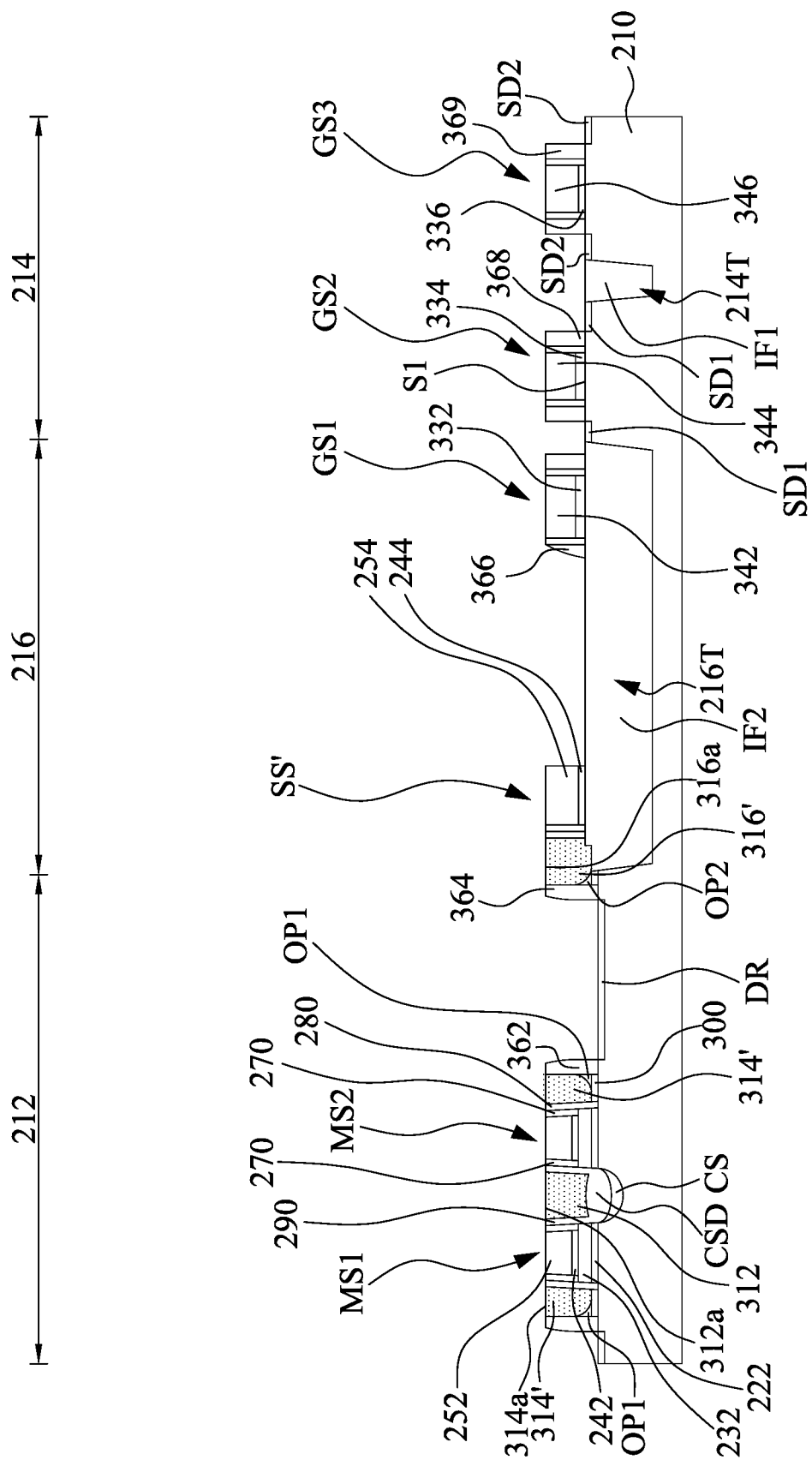

Referring to FIG. 1C and FIG. 26, the method 100 proceeds to step 148 where a planarization process is optionally performed to remove the hard masks 262, 264, 365, 354, and 356. For example, the planarization process is an etch back process. After the etch back process, the top surface 312a of the erase gate 312, the top surfaces of the control gates 252 and 254, the top surfaces 314a of the select gates 314', a top surface 316a of the dummy gate 316' and top surfaces of the gate electrodes 342, 344, and 346 are exposed.

Figure 27:
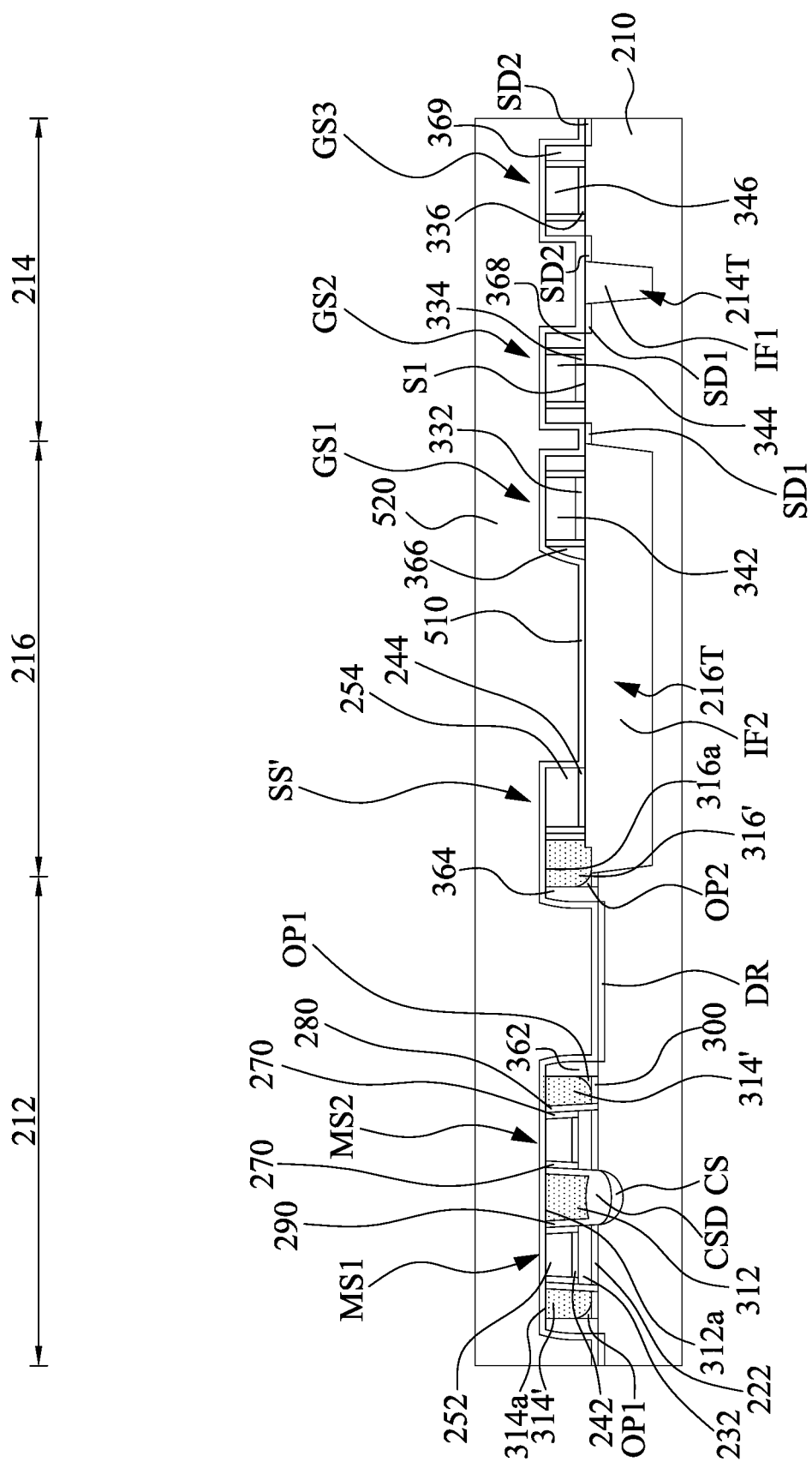

Referring to FIG. 1C and FIG. 27, the method 100 proceeds to step 150 where an etch stop layer 510 is conformally formed over the gate stack MS1, MS2, the stack SS', the dummy gate stack GS1, the high voltage gate stack GS2, and the logic gate stack GS3, and an interlayer dielectric (ILD) 520 is formed over the etching stop layer 510.

The etch stop layer 510 is, for example, a nitrogen-containing layer or a carbon-containing layer, such as SiN, SiC or SiCN. The ILD 520 can contain one or more than one dielectric layers, which may be formed by a chemical vapor deposition (CVD) process, a spin coating process, or other suitable process that can form any dielectric materials. The ILD 520 includes, for example, an extreme low-K dielectric (i.e., a dielectric with a dielectric constant κ less than 2).

Figure 28:
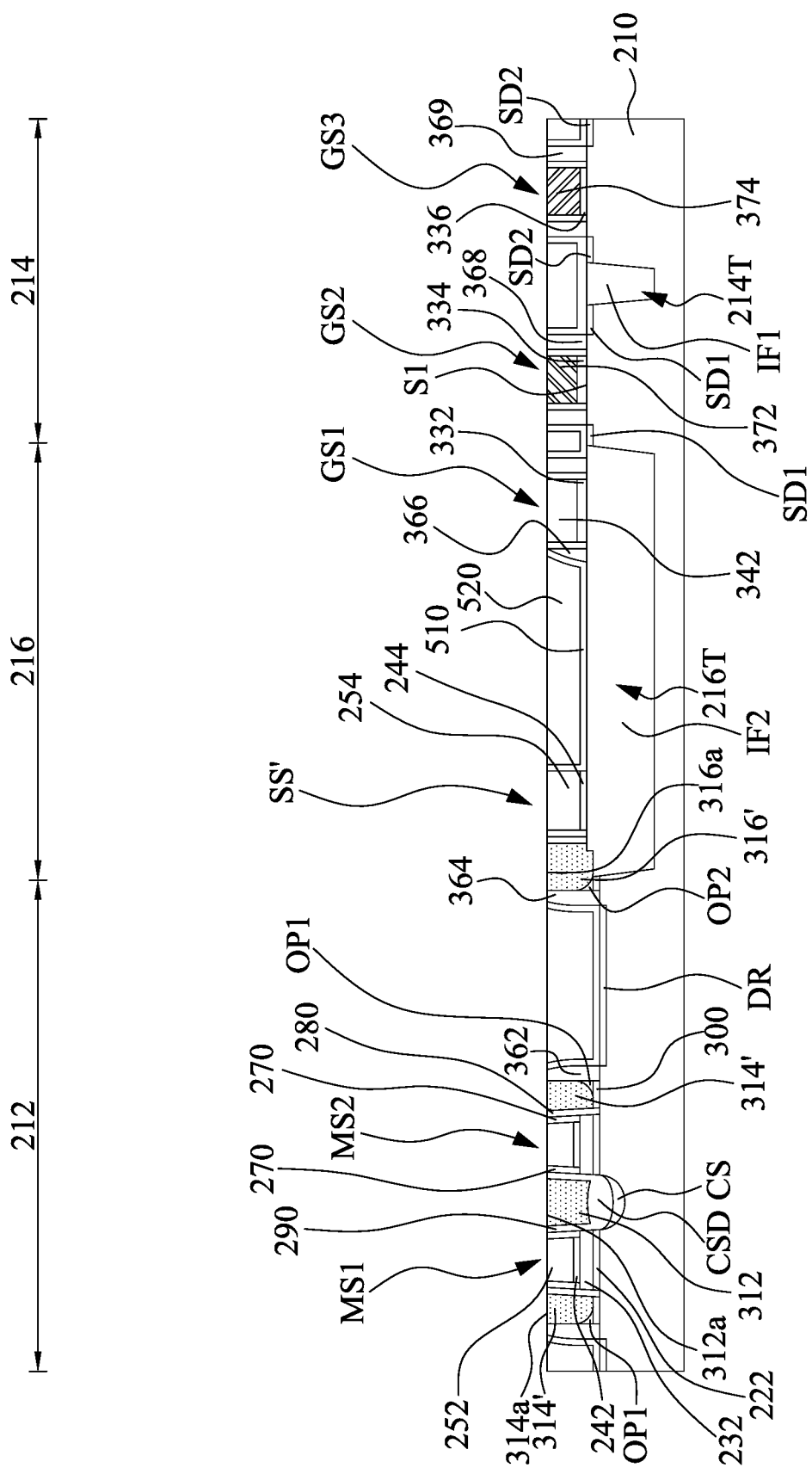

Referring to FIG. 1C and FIG. 28, the method 100 proceeds to step 152 where a planarization process and a replacement gate (RPG) process is performed. For example, the planarization process includes a chemical mechanical polish (CMP) process. Herein, the CMP process substantially levels a top surface of the ILD 520 with top surfaces of the gate stacks MS1 and MS2, the stack SS', the dummy gate stack GS1, the high voltage gate stack GS2 and the logic gate stack GS3. After the CMP process, the top surfaces 314a of the select gates 314', the top surface 316a of the dummy gate 316' and the top surface 312a of the erase gate 312 are exposed, and the top surfaces of the gate stacks MS1 and MS2, the dummy gate stack GS1, the high voltage gate stack GS2 and the logic gate stack GS3 may are exposed.

In some embodiments, the RPG process is performed to the high voltage gate stack GS2 and the logic gate stack GS3. For example, the polysilicon gate electrodes 344 and 346 (referring to FIG. 27) are removed, such that a gate trench is formed between the spacers 368, and a gate trench is formed between the spacers 369. Then, a metal layer overfills the gate trenches, and a CMP process is performed to remove an excess portion of the metal layer outside the gate trenches. Through the operation, gate metals 372 and 374 are formed.

Figure 29:
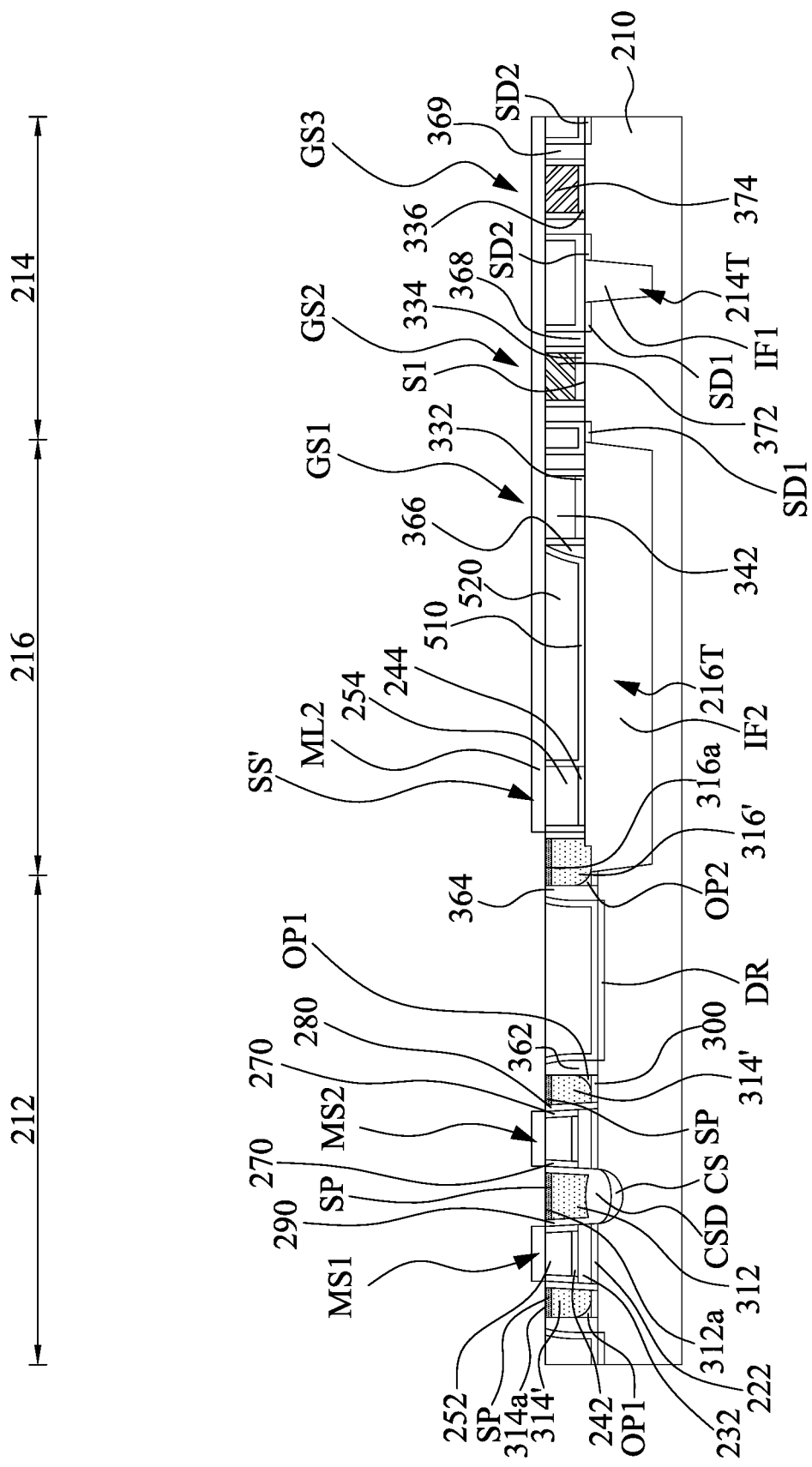

Referring to FIG. 1C and FIG. 29, the method 100 proceeds to step 154 where a silicidation process is performed to the exposed top surface 314a of the select gates 314', the exposed top surface 312a of the erase gate 312, and the exposed top surface 316a of the dummy gate 316', such that silicide portions SP are formed adjacent the top surfaces 312a, 314a, and 316a of the erase gate 312, the select gates 314', and the dummy gate 316'. Herein, a mask layer ML2 may be formed over the top surfaces of the gate stacks MS1 and MS2, the stack SS', the dummy gate stack GS1, the high voltage gate stack GS2, and the logic gate stack GS3, so as to protect the stacks MS1, MS2, SS', GS1, GS2, and GS3 from silicidation.

Figure 30A:
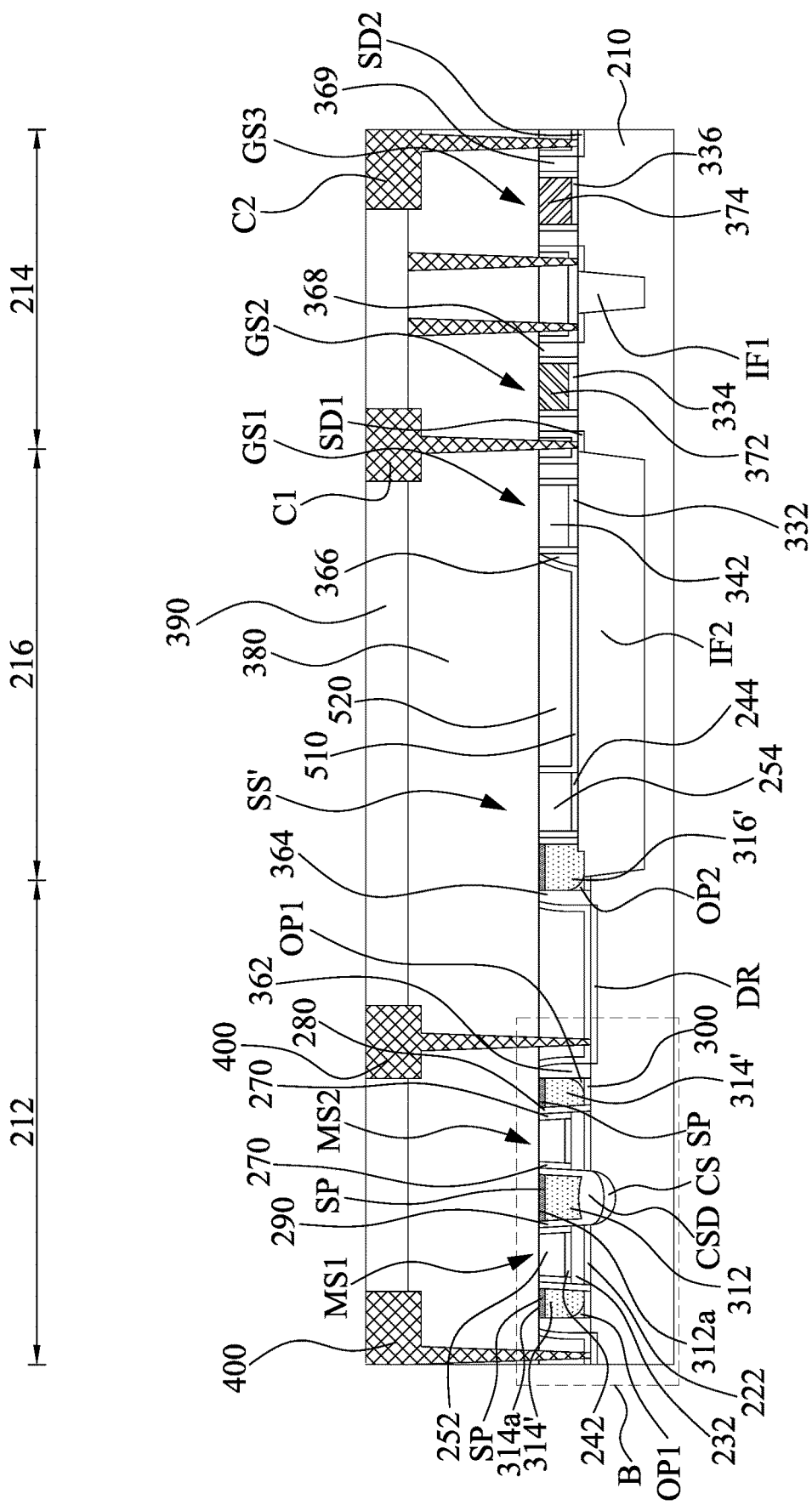
Figure 30B:
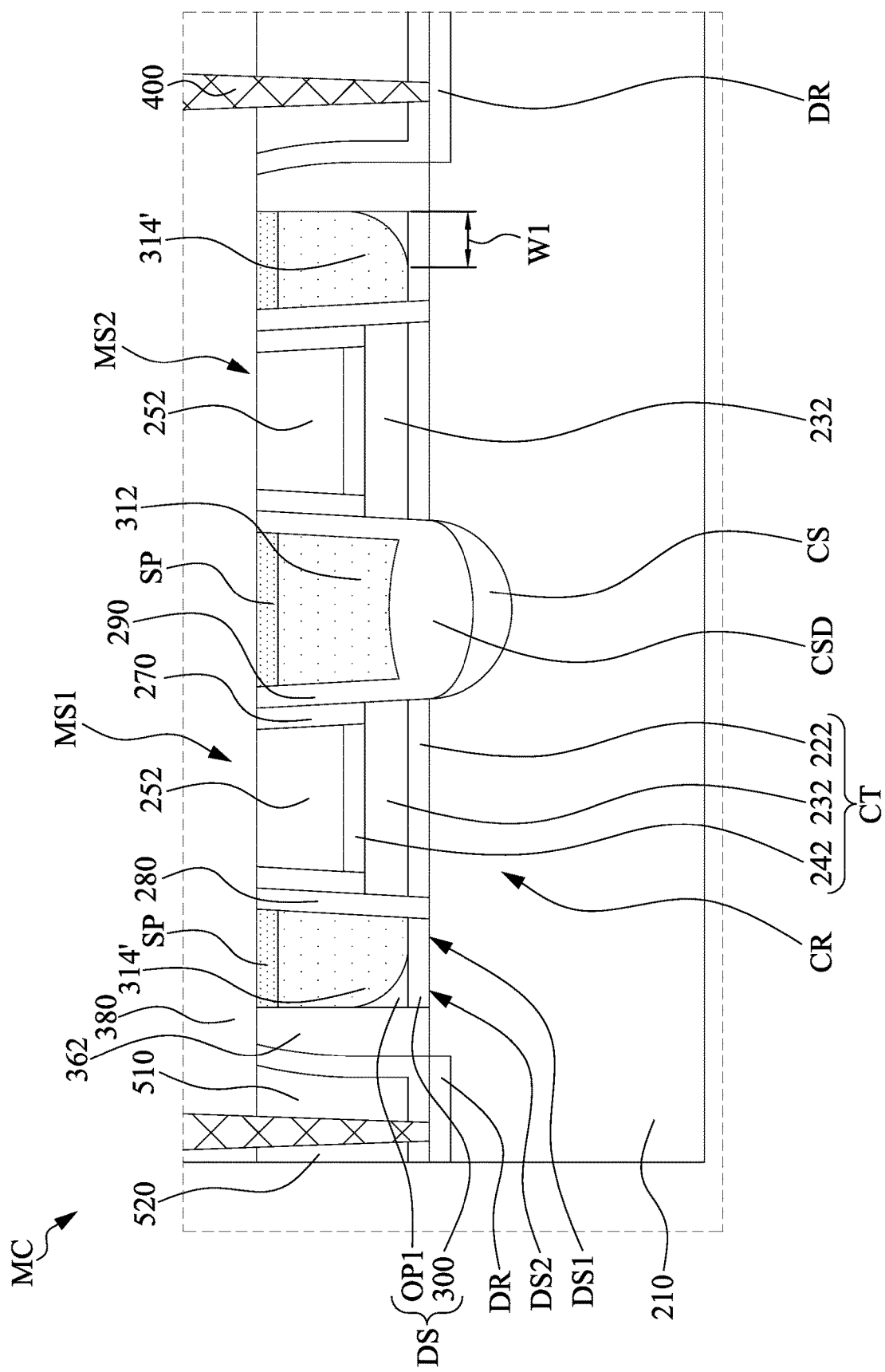

Referring to FIG. 1C, FIG. 30A and FIG. 30B, the method 100 proceeds to step 156 where drain contacts 400 and source/drain contacts C1 and C2 are formed. ILD layers 380 and 390 are formed over the structure of FIG. 29, and then an etching process is performed to form holes to expose the drain regions DR and the source/drain regions SD1 and SD2. A metal layer may fill the holes, and an excess portion of the metal layer outside the holes are removed by suitable etching or planarization process, such that the drain contacts 400 connecting the drain regions DR and the source/drain contacts C1 and C2 respectively connecting the source/drain regions SD1 and SD2 are formed.

FIG. 30B is a partial enlarged drawing of the portion B in FIG. 30A. A memory cell MC is formed. The memory cell MC includes a channel region CR, a source region CS, and two drain regions DR, two gate stacks MS1 and MS2, one erase gate 312, and two select gate 314'. The channel region CR, a source region CS, and two drain regions DR are in the substrate 210, and the channel region CR is between the source region CS and the drain region DR. The gate stacks MS1/MS2 and the select gate 314' are disposed over the channel region CR. Each of the gate stacks MS1 and MS2 may include a control gate 252 and a charge trapping structure CT between the control gate 252 and the semiconductor substrate 210. The charge trapping structure CT includes the tunneling layer 222, the floating gate 232, and the blocking layer 242. The memory cells MC further include a dielectric structure DS between the select gate 314' and the semiconductor substrate 210 for providing electrical isolation. In some embodiments, the dielectric structure DS between the select gates 314' and the semiconductor substrate 210 includes the oxide portion OP1 and the select gate dielectric layer 300.

Herein, since the oxide portion OP1 and the select gate 314' are formed from the same feature (e.g., the select gate 314 of FIG. 15), the select gate 314' is in contact with the oxide portion OP1. In some embodiments, the oxide portion OP1 and the select gate 314' are in contact with the same surface of the select gate dielectric layer 300 and the same surface of the spacer 362. Similarly, referring back to FIG. 30A, since the oxide portion OP2 and the dummy gate 316' are formed from the same feature (e.g., the dummy gate 316 of FIG. 15), the dummy gate 316' is in contact with the oxide portion OP2. In some embodiments, the oxide portion OP2 and the dummy gate 316' are in contact with the same surface of the select gate dielectric layer 300 and the same surface of the spacer 364.

In some embodiments, the memory cells MC are applicable to an embedded flash memory. For the embedded flash memory, the $V_{BL\_SG}$ between the drain region DR1 and the select gate 314 is in a range of about 1 Volts to about 2 Volts, such that a strong electrical field is built between the drain region DR and the select gate 314'. The strong electrical field may induce gate-induced drain leakage (GIDL). In some embodiments of the present disclosure, through the configuration of the oxide portion OP1, the dielectric structure DS between the select gates 314' and the drain regions DR becomes thicker, such that the gate-induced drain leakage (GIDL) current is reduced. To be specific, the dielectric structure DS has a first part DS1 and a second part DS2 below the select gate 314', in which the first part DS1 is between the gate stacks MS1/MS2 and the second part DS2 is between the spacer 362 and the first part DS1. The second part DS2 is thicker than the first part DS1. Furthermore, the first part DS1 of the dielectric structure DS includes a first portion of a select gate dielectric layer 300. The second part DS2 of the dielectric structure DS includes a second portion of the select gate dielectric layer 300 and an oxide portion OP1 over the second portion of the select gate dielectric layer 300. In some embodiments, the oxide portion OP1/OP2 is distinguishable from native oxides. For example, a top surface of the oxide portion OP1/OP2 is upward-curved, and the oxide portion OP1/OP2 may have a width W1 greater than 5 angstroms which is believed to be distinguishable from native oxides. For example, the width W1 may be in a range of about 5 angstroms to 100 angstroms.

Figure 31A:
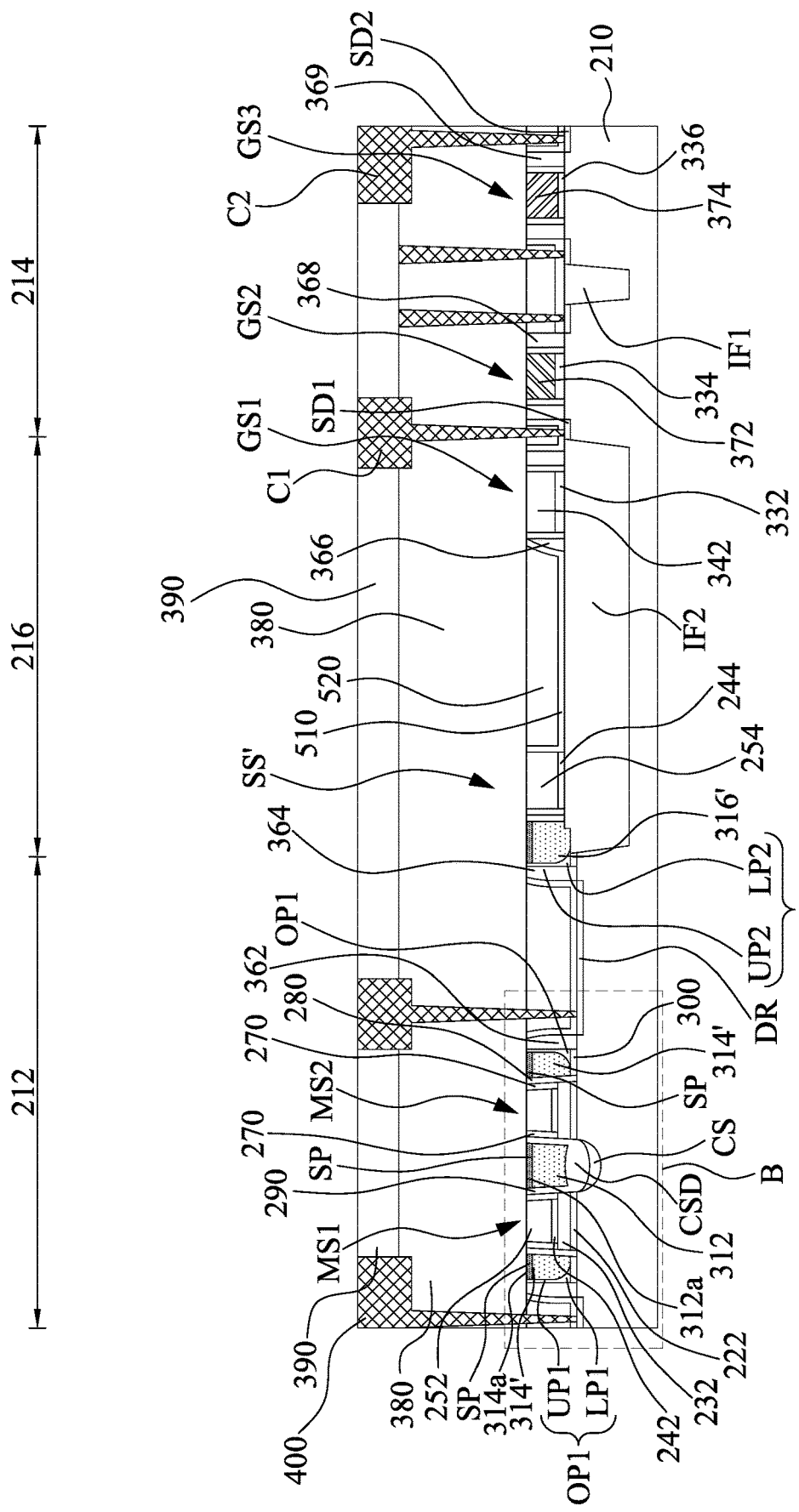
FIG. 31A is a cross-sectional view of a semiconductor device in accordance with some embodiments.
Figure 31B:
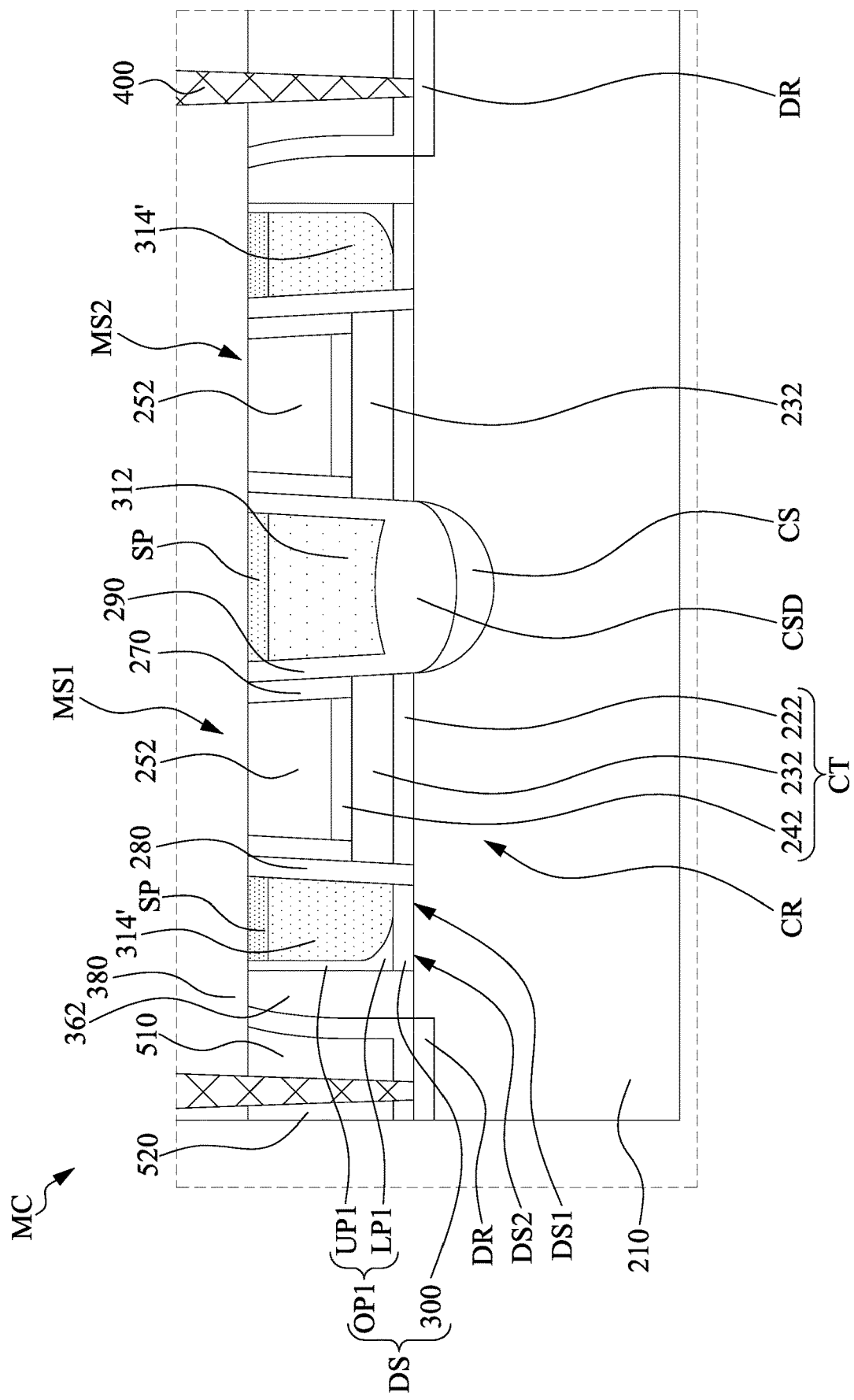
FIG. 31B is a partial enlarged drawing of a portion in FIG. 31A.

FIG. 31A is a cross-sectional view of a semiconductor device in accordance with some embodiments. FIG. 31B is a partial enlarged drawing of the portion B in FIG. 31A. The embodiments of FIGS. 31A and 31B are similar to the embodiments of FIGS. 30A and 30B. The difference between the embodiments of FIGS. 31A and 31B and the embodiments of FIGS. 30A and 30B is at least: the upper portions UP1/UP2 of the oxide portions OP1/OP2 are not removed by the cleaning process in FIG. 17 and/or the etching process in FIG. 23. For example, the cleaning/etching process are performed with suitable conditions (e.g., less time duration and/or less times) such that the upper portions UP1/UP2 are not removed. As such, the upper portion UP1 remains between the spacer 362 and the select gate 314', and the upper portion UP2 remains between the spacer 364 and the dummy gate 316'. Due to the presence of the upper portion UP1/UP2 of the oxide portion OP1/OP2, the spacers 362/364 are not in direct contact with the select gates 314'/the dummy gate 316'. Other details of the embodiments are similar to those aforementioned embodiments, and not repeated herein.

Figure 32A:
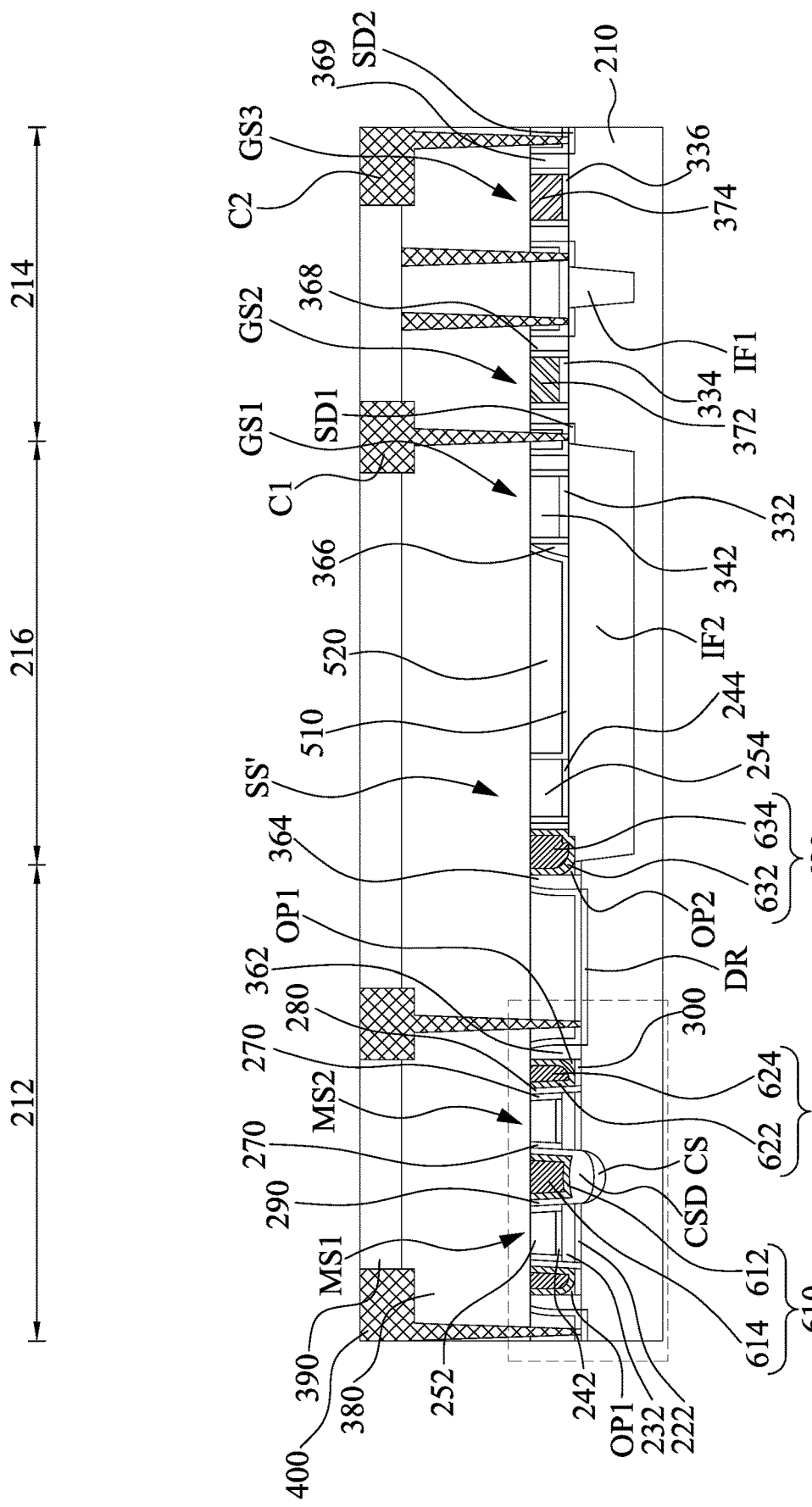
FIG. 32A is a cross-sectional view of a semiconductor device in accordance with some embodiments.
Figure 32B:
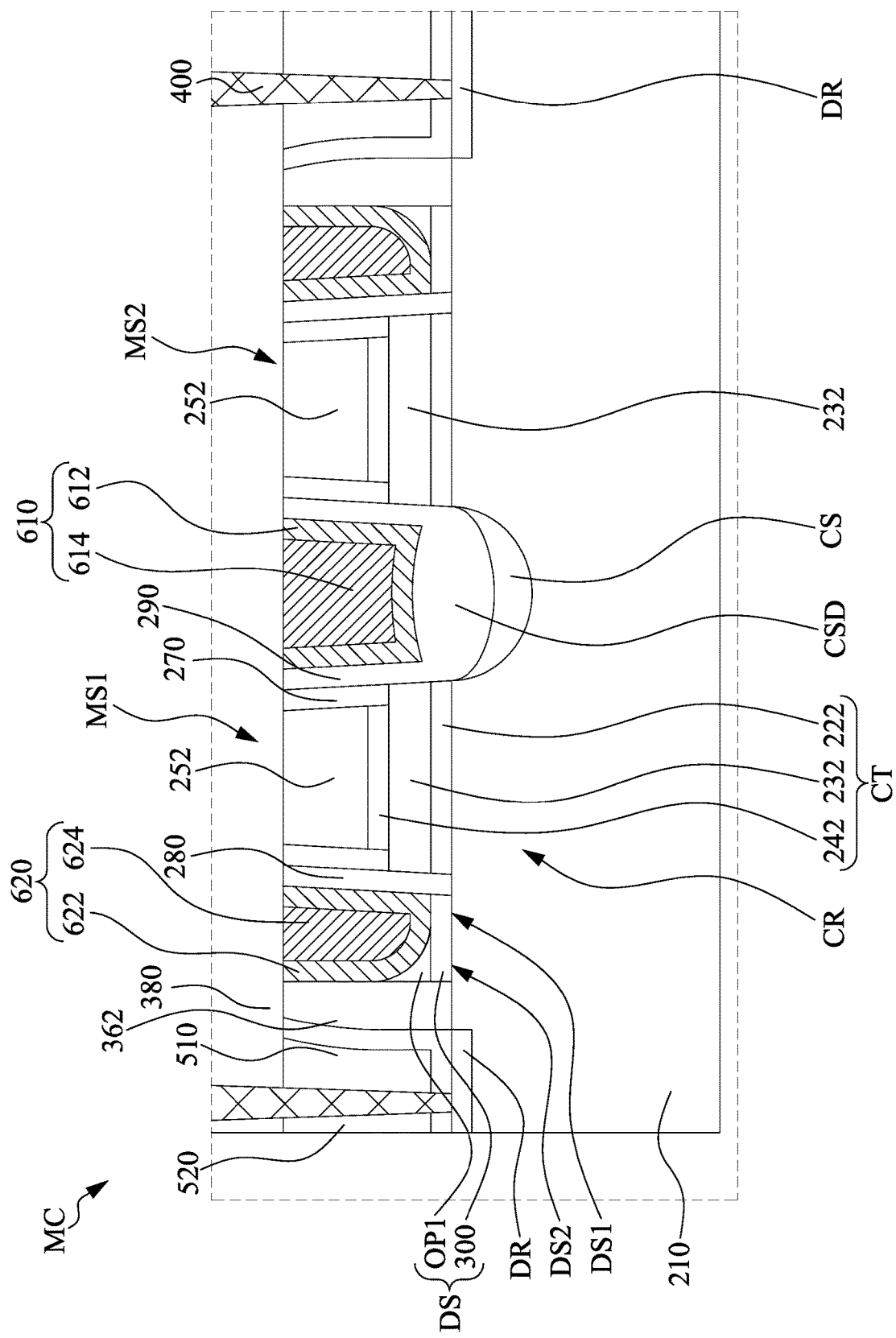
FIG. 32B is a partial enlarged drawing of a portion in FIG. 32A.

FIG. 32A is a cross-sectional view of a semiconductor device in accordance with some embodiments. FIG. 32B is a partial enlarged drawing of the portion B in FIG. 32A. The embodiments of FIGS. 32A and 32B are similar to the embodiments of FIGS. 30A and 30B. The difference between the embodiments of FIGS. 32A and 32B and the embodiments of FIGS. 30A and 30B is at least: at least one of the erase gate 312 (referring to FIG. 28) is replaced by an erase gate 610 having a work function metal layer 612 and a metal gate 614, and at least one of the select gates 314' (referring to FIG. 28) is replaced by a select gate 620 having a work function metal layer 622 and a metal gate 624. In some embodiments, the dummy gate 316' (referring to FIG. 28) is replaced by a dummy gate 630 having a work function metal layer 632 and a metal gate 634. Herein, the oxide portion OP1/OP2 and the select gate 620/the dummy gate 630 are in contact with the same surface of the select gate dielectric layer 300. Also, the oxide portion OP1/OP2 and the select gate 620/the dummy gate 630 may be in contact with the same surface of the spacer 362/364.

Herein, the erase gate 312, the select gates 314', and the dummy gate 316' in FIG. 28 are removed, such that trenches are left. The removal may use chlorine as a reactant gas to etch the polysilicon (e.g., the erase gate 312, the select gates 314', and the dummy gate 316' in FIG. 28). Then, a work function metal layer is conformally formed over the trenches. Subsequently, a metal material is formed over the work function metal layer and fills the trenches. A CMP process may be applied to remove excess portions of the work function metal layer and the metal material outside the trenches, such that the work function metal layers 612, 622, and 632 are formed from remaining portions of the work function metal layer, and the metal gates 614, 624, and 634 are formed from remaining portions of the metal material.

The work function metal layer (e.g., the work function metal layers 612, 622, and 632) may be made of p-metal or n-metal. In some embodiments, the p-metal includes titanium nitride (TiN) or tantalum nitride (TaN), tungsten nitride (WN), titanium aluminum (TiAl), or combinations thereof. In some embodiments, the n-metal include Ta, TiAl, TiAlN, tungsten nitride (WN), titanium nitride (TiN), tantalum nitride (TaN) or combinations thereof. The work function metal layer can be formed by a suitable process, such as PVD. In some embodiments, the metal material may be any suitable metal, metal alloy, or the combination thereof. For example, the metal material (e.g., the metal gates 614, 624, and 634) includes aluminum (Al), titanium (Ti), tantalum (Ta), tungsten (W), niobium (Nb), molybdenum (Mo), copper (Cu) according to various embodiments. The method to form the metal material may include CVD or PVD. In some embodiments, the erase gate 610, the select gate 620, and the dummy gate 630 does not include the work function metal layer, but the erase gate 610, the select gate 620, and the dummy gate 630 are formed of the metal material. Other details of the embodiments are similar to those aforementioned embodiments, and not repeated herein.

Figure 33A:
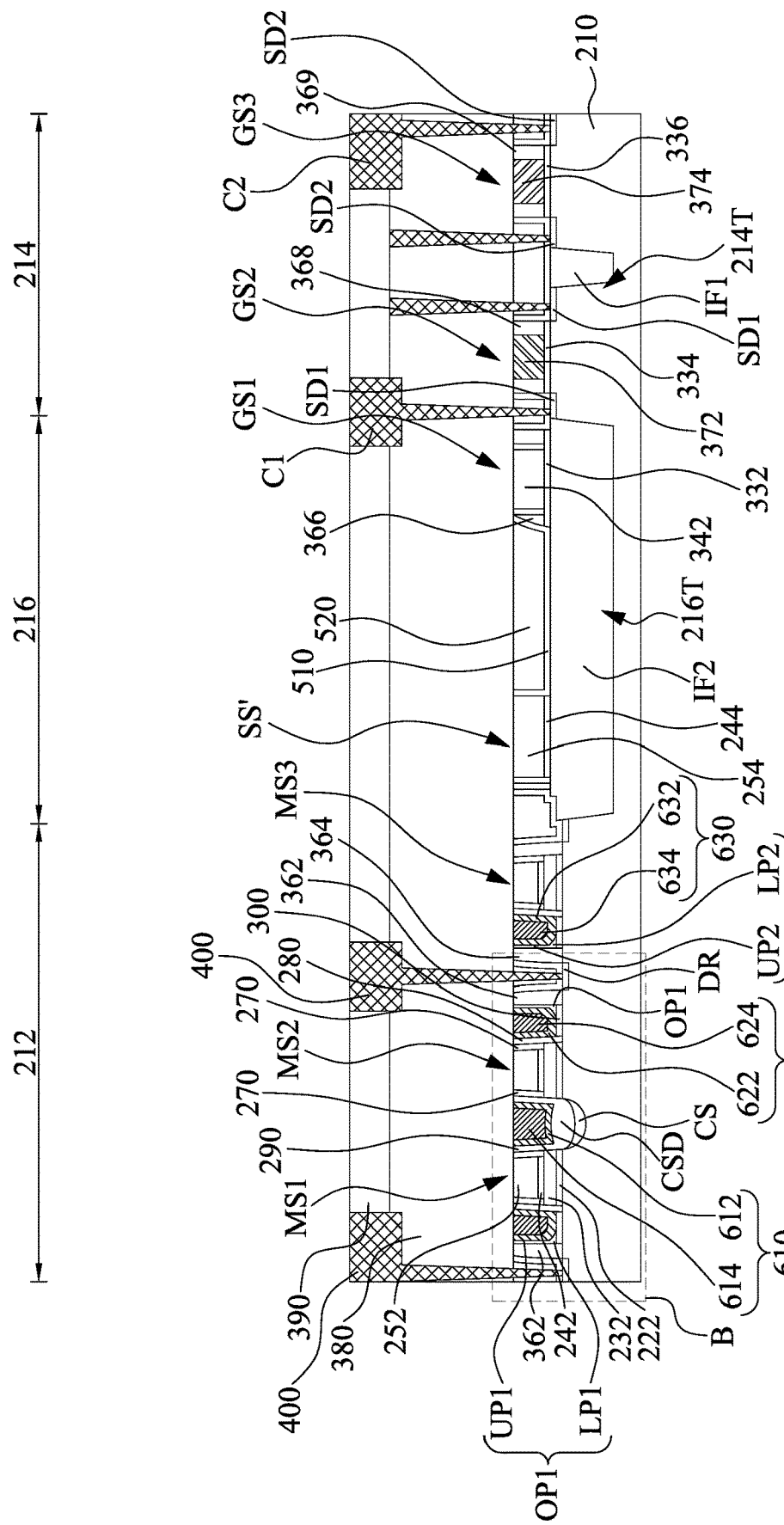
FIG. 33A is a cross-sectional view of a semiconductor device in accordance with some embodiments.
Figure 33B:
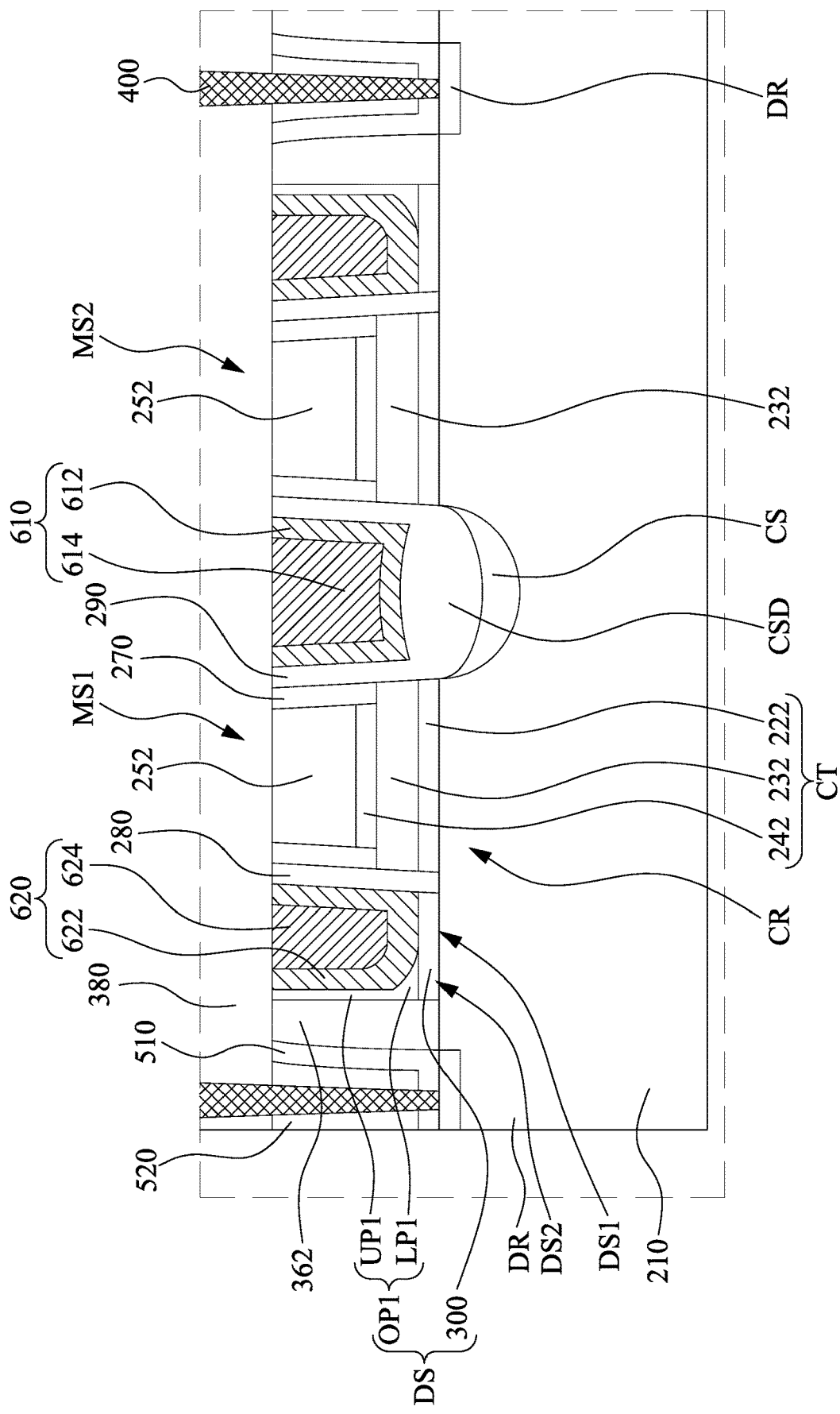
FIG. 33B is a partial enlarged drawing of a portion in FIG. 33A.

FIG. 33A is a cross-sectional view of a semiconductor device in accordance with some embodiments. FIG. 33B is a partial enlarged drawing of the portion B in FIG. 33A. The embodiments of FIGS. 33A and 33B are similar to the embodiments of FIGS. 32A and 32B. The difference between the embodiments of FIGS. 33A and 33B and the embodiments of FIGS. 32A and 32B is at least: the oxide portion OP1 has an upper portion UP1 between the spacer 362 and the select gate 620, and the oxide portion OP2 has an upper portion UP2 between the spacer 364 and the dummy gate 630. Through the configuration, the oxide portion OP1 separates the select gate 620 from the spacers 362, and the oxide portion OP2 separates the dummy gate 630 from the spacers 364. The spacers 362/364 are not in direct contact with the select gate 620/the dummy gate 630. It is noted that in the previous embodiments, the upper portions of the oxide portions OP1 and OP2 may be removed by suitable etching process before the formation of the spacers 362, 364, 366, 368, and 369, and not shown in the figures. Other details of the embodiments are similar to those aforementioned embodiments, and not repeated herein.

Figure 34A:
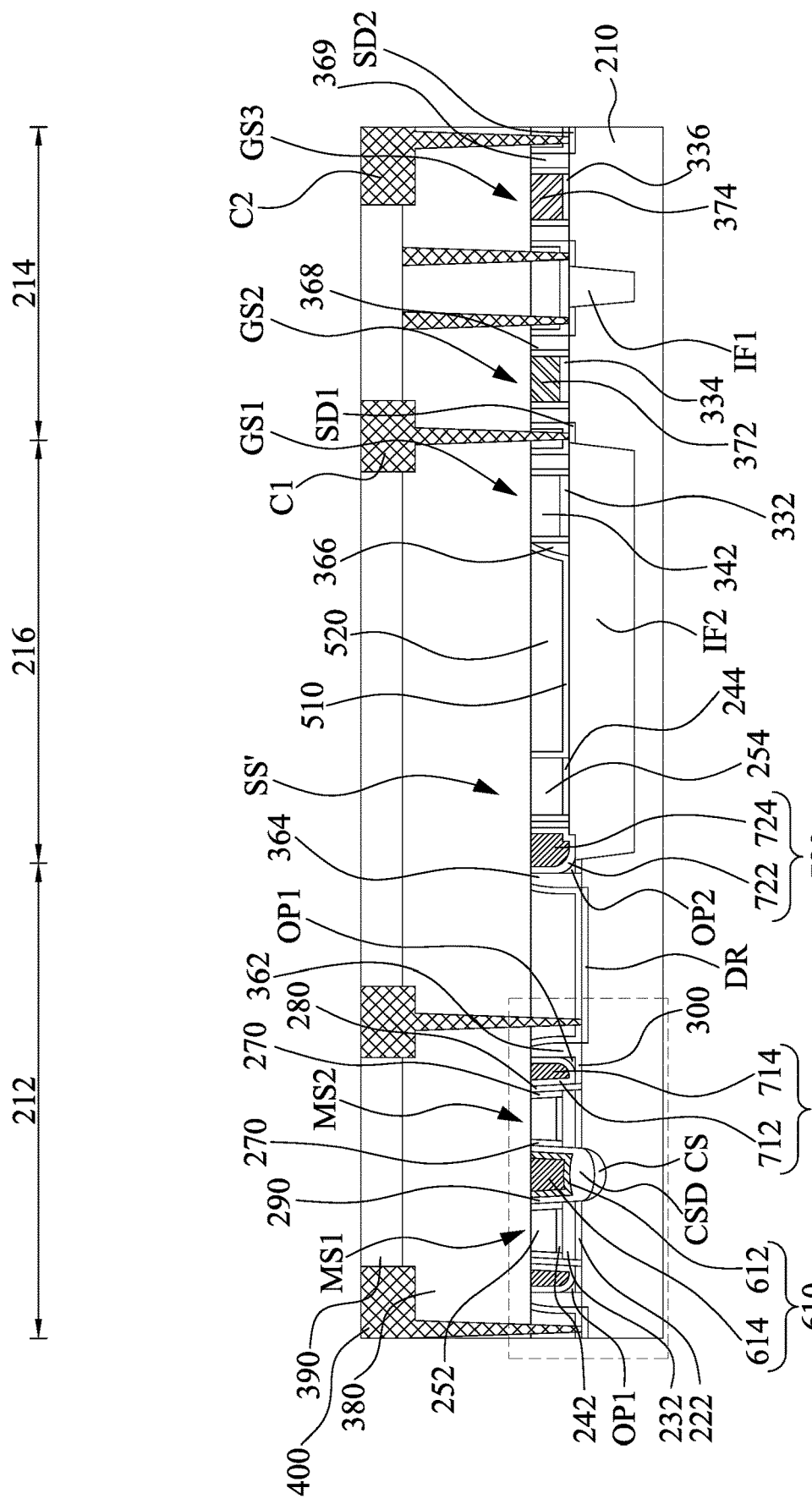
FIG. 34A is a cross-sectional view of a semiconductor device in accordance with some embodiments.
Figure 34B:
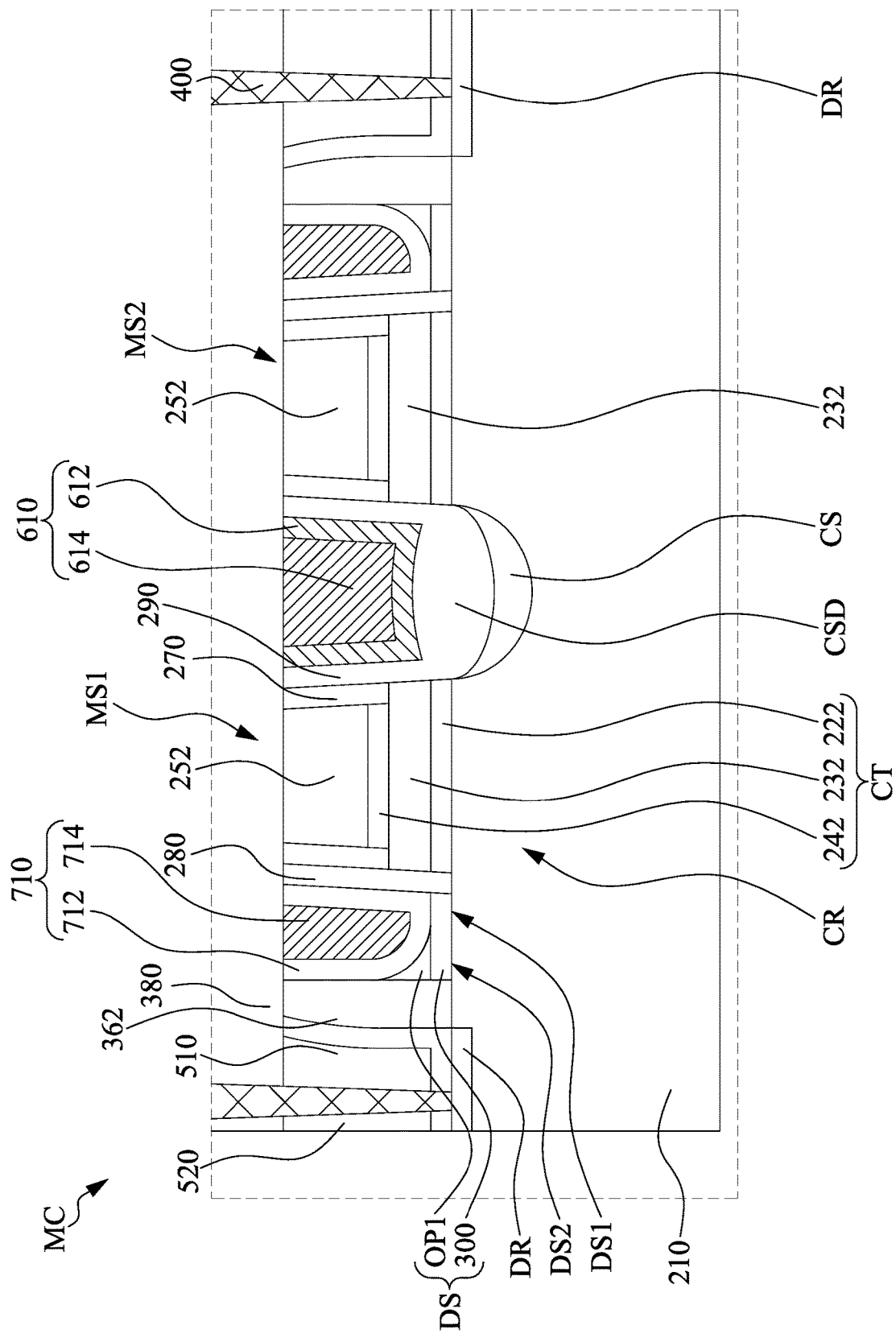
FIG. 34B is a partial enlarged drawing of a portion in FIG. 34A.

FIG. 34A is a cross-sectional view of a semiconductor device in accordance with some embodiments. FIG. 34B is a partial enlarged drawing of the portion B in FIG. 34A. The embodiments of FIGS. 34A and 34B are similar to the embodiments of FIGS. 32A and 32B. The difference between the embodiments of FIGS. 34A and 34B and the embodiments of FIGS. 32A and 32B is at least: the select gates 314' (referring to FIG. 28) is replaced by a gate stack 710 having a gate dielectric layer 712 and a select gate 714. In some embodiments, the dummy gate 316' (referring to FIG. 28) is replaced by a dummy gate stack 720 including a gate dielectric layer 722 and a dummy gate 724. Herein, the oxide portion OP1/OP2 and the gate dielectric layers 712/722 are in contact with the same surface of the select gate dielectric layer 300. Also, the oxide portion OP1/OP2 and the gate dielectric layers 712/722 may be in contact with the same surface of the spacer 362/364. The gate dielectric layers 712/722 may be made of suitable high-k materials, other non-conductive materials, or combinations thereof. Examples of the high-k material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the select gate 714 and the dummy gate 724 may include a work function metal layer and a metal gate as aforementioned. Other details of the present embodiments are similar to that of previous embodiments, and not repeated herein.

Figure 35A:
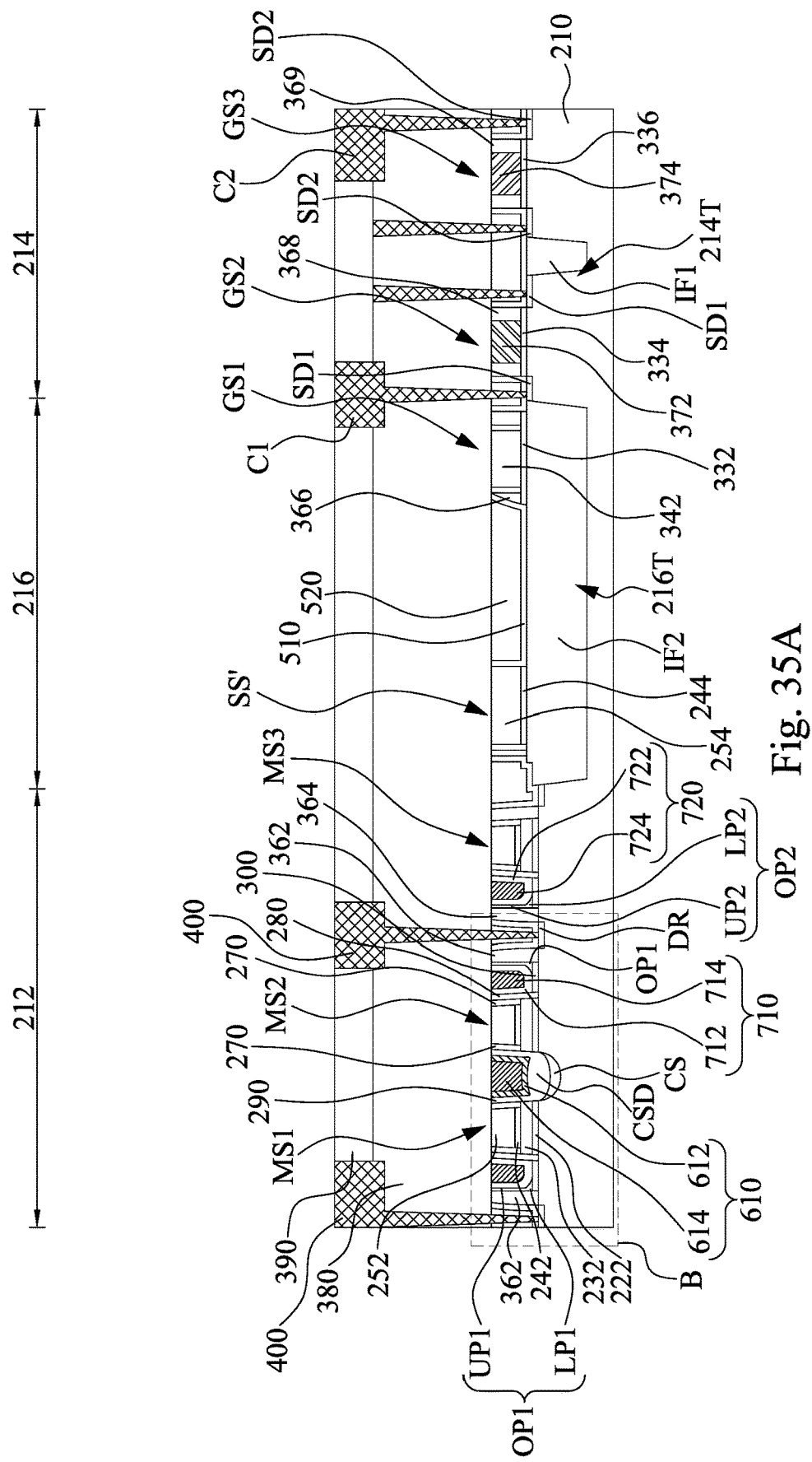
FIG. 35A is a cross-sectional view of a semiconductor device in accordance with some embodiments.
Figure 35B:
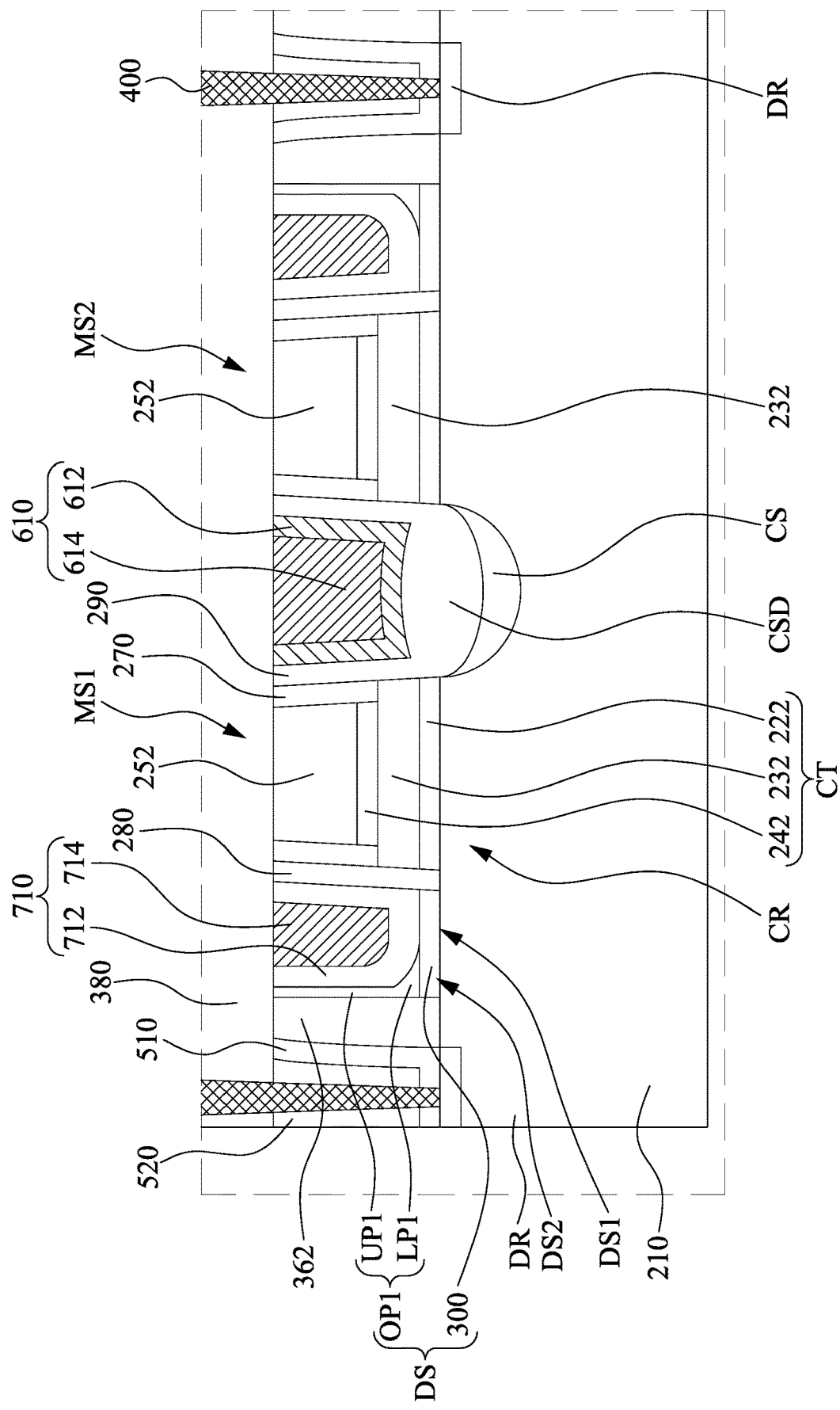
FIG. 35B is a partial enlarged drawing of a portion in FIG. 35A.

FIG. 35A is a cross-sectional view of a semiconductor device in accordance with some embodiments. FIG. 35B is a partial enlarged drawing of the portion B in FIG. 35A. The embodiments of FIGS. 35A and 35B are similar to the embodiments of FIGS. 34A and 34B. The difference between the embodiments of FIGS. 35A and 35B and the embodiments of FIGS. 34A and 34B is at least: the oxide portion OP1 has an upper portion UP1 between the spacer 362 and the gate dielectric layer 712, and the oxide portion OP2 has an upper portion UP2 between the spacer 364 and the gate dielectric layers 722. Through the configuration, the oxide portion OP1 separates the gate dielectric layers 712 from the spacers 362, and the oxide portion OP2 separates the gate dielectric layers 722 from the spacers 364. The spacers 362/364 are not in direct contact with the gate dielectric layers 712/722. Other details of the embodiments are similar to those aforementioned embodiments, and not repeated herein.

The present invention is applicable to fabrication of an embedded flash memory to afford low power consumption microelectronics fabrications. Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the thicker gate dielectric structure including the silicon oxide provided at the edge of the polycrystalline silicon select gate by thermal oxidation results in attenuated gate induced drain leakage (GIDL) current, thereby reducing power consumption. Another advantage is that the thicker gate dielectric structure including the silicon oxide at the select gate edge also reduces the gate-drain overlap capacitance, which improves the high-frequency performance of the FET device.

According to some embodiments, a semiconductor device includes a semiconductor substrate, a control gate, a select gate, a charge trapping structure, and a dielectric structure. The semiconductor substrate has a drain region, a source region, and a channel region between the drain region and the source region. The control gate is over the channel region of the semiconductor substrate. The select gate is over the channel region of the semiconductor substrate and separated from the control gate. The charge trapping structure is between the control gate and the semiconductor substrate. The dielectric structure is between the select gate and the semiconductor substrate. The dielectric structure has a first part adjacent to the charge trapping structure and a second part away from the charge trapping structure, and the second part is thicker than the first part.

According to some embodiments, a semiconductor device includes a semiconductor substrate, a control gate, a select gate, a charge trapping structure, and an dielectric structure. The semiconductor substrate has a drain region, a source region, and a channel region between the drain region and the source region. The control gate is over the channel region of the semiconductor substrate. The select gate is over the channel region of the semiconductor substrate and separated from the control gate. The charge trapping structure is between the control gate and the semiconductor substrate. The dielectric structure is between the select gate and the semiconductor substrate. The dielectric structure and the select gate forms an interface sloped with respect to a top surface of the semiconductor substrate.

According to some embodiments, a method for manufacturing a semiconductor device is provided, the method including: forming a gate stack over a semiconductor substrate, wherein the gate stack comprises a charge trapping structure and a control gate over the charge trapping structure; forming an inter-gate dielectric layer alongside the gate stack; forming a select gate alongside the inter-gate dielectric layer; and converting a portion of the select gate away from the control gate into a dielectric portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor substrate having a drain region, a source region and a channel region between the drain region and the source region;
    a control gate over the channel region of the semiconductor substrate;
    a select gate over the channel region of the semiconductor substrate and separated from the control gate;
    a charge trapping structure between the control gate and the semiconductor substrate;
    a dielectric structure between the select gate and the semiconductor substrate, wherein the dielectric structure has a first part and a second part, the first part is between the charge trapping structure and the second part, and the second part is thicker than the first part, wherein the second part of the dielectric structure comprises a first dielectric layer and a second dielectric layer over the first dielectric layer; and
    a spacer, wherein the select gate and the dielectric structure are between the spacer and the control gate, and the second part of the dielectric structure and the select gate are in contact with a same surface of the spacer.

2. The semiconductor device of claim 1, wherein the second part of the dielectric structure comprises oxide.

3. The semiconductor device of claim 1, wherein the second part of the dielectric structure comprises silicon oxide, and the select gate comprises polysilicon.

4. The semiconductor device of claim 1, wherein the second part of the dielectric structure is in contact with the select gate.

5. The semiconductor device of claim 1, wherein the second dielectric layer comprises silicon oxide.

6. The semiconductor device of claim 1, wherein the select gate and the dielectric structure form a curved interface.

7. The semiconductor device of claim 1, wherein the first part and the second part of the dielectric structure comprise silicon oxide.

8. The semiconductor device of claim 1, further comprising:
    an inter-gate dielectric layer between the control gate and the select gate, wherein the first part of the dielectric structure is between the inter-gate dielectric layer and the second part of the dielectric structure.

9. A semiconductor device, comprising:
    a semiconductor substrate having a drain region, a source region and a channel region between the drain region and the source region;
    a control gate over the channel region of the semiconductor substrate;
    a select gate over the channel region of the semiconductor substrate and separated from the control gate;
    a charge trapping structure between the control gate and the semiconductor substrate; and
    a dielectric structure between the select gate and the semiconductor substrate, wherein the dielectric structure and the select gate form an interface sloped with respect to a top surface of the semiconductor substrate, and the dielectric structure has a thickness that increases as a distance from the charge trapping structure increases.

10. The semiconductor device of claim 9, wherein the select gate comprises polysilicon, and the dielectric structure comprises silicon oxide.

11. The semiconductor device of claim 9, wherein the dielectric structure comprises a first dielectric layer and a second dielectric layer over the first dielectric layer, wherein the second dielectric layer comprises oxide.

12. The semiconductor device of claim 9, further comprising:
    a spacer, wherein the select gate is between the spacer and the control gate, and a top end of the interface between the dielectric structure and the select gate is in contact with the spacer.

13. A semiconductor device, comprising:
    a semiconductor substrate having a drain region, a source region and a channel region between the drain region and the source region;
    a control gate over the channel region of the semiconductor substrate;
    a select gate over the channel region of the semiconductor substrate and separated from the control gate, wherein the select gate has a first part and a second part, the first part is between the control gate and the second part, and a bottom surface of the second part is higher than a bottom surface of the first part;
    a charge trapping structure between the control gate and the semiconductor substrate; and
    a dielectric structure between the select gate and the semiconductor substrate, wherein the dielectric structure has a thickness that increases as a distance from the charge trapping structure increases, a portion of the dielectric structure directly below the second part of the select gate comprises a first dielectric layer and a second dielectric layer over the first dielectric layer, and the second dielectric layer comprises oxide.

14. The semiconductor device of claim 13, wherein the bottom surface of the second part of the select gate is curved.

15. The semiconductor device of claim 13, wherein the select gate has a first sidewall facing the control gate and a second sidewall facing away from the control gate, and the second sidewall of the select gate is shorter than the first sidewall of the select gate.

16. The semiconductor device of claim 13, further comprising:
    a spacer, wherein the select gate is between the spacer and the control gate, and the second part of the select gate is in contact with the spacer.

17. The semiconductor device of claim 13, wherein a top surface of the first part of the select gate is substantially coplanar with a top surface of the second part of the select gate.

18. The semiconductor device of claim 13, wherein the bottom surface of the first part of the select gate is substantially flat.

19. The semiconductor device of claim 13, further comprising:

an inter-gate dielectric layer between the control gate and the select gate, wherein the first part of the select gate is in contact with the inter-gate dielectric layer.

20. The semiconductor device of claim 1, further comprising:
an inter-gate dielectric layer between the control gate and the select gate, wherein the first part of the dielectric structure is in contact with the inter-gate dielectric layer.

* * * * *